(12) United States Patent
Tohidian et al.

(10) Patent No.: US 9,148,125 B2
(45) Date of Patent: Sep. 29, 2015

(54) HIGH ORDER DISCRETE TIME CHARGE ROTATING PASSIVE INFINITE IMPULSE RESPONSE FILTER

(71) Applicant: Technische Universiteit Delft, Delft (NL)

(72) Inventors: Massoud Tohidian, Delft (NL); Iman Madadi, Delft (NL); Robert Bogdan Staszewski, Delft (NL)

(73) Assignee: Technische Universiteit Delft, Delft (NL)

( * ) Notice: Subject to any disclaimer, the term of this patent is extended or adjusted under 35 U.S.C. 154(b) by 167 days.

(21) Appl. No.: 14/039,466

(22) Filed: Sep. 27, 2013

(65) Prior Publication Data

US 2014/0354376 A1    Dec. 4, 2014

Related U.S. Application Data

(60) Provisional application No. 61/829,976, filed on May 31, 2013.

(51) Int. Cl.
*G06G 7/02* (2006.01)
*H03H 15/00* (2006.01)
*H03D 3/00* (2006.01)
*H04B 1/16* (2006.01)

(52) U.S. Cl.
CPC ............... *H03H 15/00* (2013.01); *H03D 3/007* (2013.01); *H04B 1/16* (2013.01)

(58) Field of Classification Search
CPC ............ H03H 15/00; H03D 3/007; H04B 1/16
USPC .......................................................... 708/819
See application file for complete search history.

(56) References Cited

U.S. PATENT DOCUMENTS

2010/0198898 A1*   8/2010   Pan et al. .................. 708/313

OTHER PUBLICATIONS

Tohidian, Massoud et al., "A 2mW 800MS/s 7th-Order Discrete-Time IIR Filter with 400kHz-to-30MHz BW and 100dB Stop-Band Rejection in 65nm CMOS," IEEE ISSCC 2013, pp. 174-175, Feb. 2013.
Muhammad, K. et al., "A Discrete-Time Bluetooth Receiver in a 0.13μm Digital CMOS Process," IEEE ISSCC 2004, vol. 527, pp. 268-269, Feb. 2004.
Gregorian, R. & Temes, G., "Analog MOS Integrated Circuits for Signal Processing," Wiley, 1986.

(Continued)

*Primary Examiner* — Tan V. Mai
(74) *Attorney, Agent, or Firm* — Howard Zaretsky; Zaretsky Patent Group PC

(57) ABSTRACT

A novel and useful high-order discrete-time charge rotating (CR) infinite impulse response (IIR) low-pass filter is presented. The filter utilizes capacitors and a $g_m$-cell, rather than operational amplifiers, and is thus compatible with digital nanoscale technology. A $7^{th}$-order charge-sampling and $6^{th}$-order voltage-sampling discrete time filter is disclosed. The order of the filter is easily extendable to higher orders. The charge rotating filter is process-scalable with Moore's law and amenable to digital nanoscale CMOS technology. Bandwidth of this filter is precise and robust to PVT variation. The filter exhibits very low power consumption per filter pole, low input-referred noise, wide tuning range, excellent linearity and low area per minimum bandwidth and filter pole.

22 Claims, 26 Drawing Sheets

(56) References Cited

OTHER PUBLICATIONS

D'Amico, S. et al., "A 4.1mW 79dB-DR 4th-order Source-Follower-Based Continuous-Time Filter for WLAN Receivers," IEEE ISSCC 2006, pp. 2713-2719, Dec. 2006.

Drost, B. et al., "A 0.55V 61dB-SNR 67dB-SFDR 7MHz 4th-Order Butterworth Filter Using Ring-Oscillator-Based Integrators in 90nm CMOS," IEEE ISSCC 2012.

Vasilopoulos, A. et al., "A Low-Power Wideband Reconfigurable Integrated Active-RC Filter With 73 dB SFDR," IEEE Journal of Solid-State Circuits, vol. 41, No. 9, pp. 1997-2008, Sep. 2006.

D'Amico, S. et al., "A 4.1-mW 10-MHz Fourth-Order Source-Follower-Based Continuous-Time Filter With 79-dB DR," IEEE Journal of Solid-State Circuits, vol. 41, No. 12, Dec. 2006.

Kousai, S. et al., "A 19.7 MHz, Fifth-Order Active-RC Chebyshev LPF for Draft IEEE802.11n With Automatic Quality-Factor Tuning Scheme," IEEE Journal of Solid-State Circuits, vol. 42, No. 11, Nov. 2007.

Lo, T. et al., "A Wide Tuning Range Gm—C Filter for Multi-Mode CMOS Direct-Conversion Wireless Receivers," IEEE Journal of Solid-State Circuits, vol. 44, No. 9, Sep. 2009.

Ghaderi, M. et al., "Narrow-Band Switched-Capacitor Bandpass Filters. IEEE Transactions on Circuits and Systems, " vol. 29, No. 8, pp. 557-572, 1982.

Nauta, B., "A CMOS Transconductance-C Filter Technique for Very High Frequencies," IEEE Journal of Solid-State Circuits, vol. 27, No. 2., pp. 142-153, 1992.

Geis, A. et al., "A 0.5 mm2 Power-Scalable 0.5-3.8-GHz CMOS DT-SDR Receiver With Second-Order RF Band-Pass Sampler," IEEE Journal of Solid-State Circuits, vol. 45, No. 11, Nov. 2010.

Pirola, A. et al., "Current-Mode, WCDMA Channel Filter With In-Band Noise Shaping," IEEE Journal of Solid-State State Circuits, vol. 45, No. 9, pp. 1770-1780, Sep. 2010.

Yuan, J., "A Charge Sampling Mixer with Embedded Filter Function for Wireless Applications," Proc. 2nd International Conference on Microwave and Millimeter Wave Technology, Beijing, China, 2000, pp. 315-318.

Oskooei, M. et al., "A CMOS 4.35-mW +22-dBm IIP3 Continuously Tunable Channel Select Filter for WLAN/WiMAX Receivers," IEEE Journal of Solid-State Circuits, vol. 46, No. 6, pp. 1382-1391, Jun. 2011.

Nossek, J.A., "Schmale Schalter-Kondensator-Bandpasse," ntzArchiv Bd. 3 (1981) H. 12.

Poberezhskiy, Y. et al., "Sampling and Signal Reconstruction Circuits Performing Internal Anti-aliasing Filtering and Their Influence on the Design of Digital Receivers and Transmitters," IEEE Transactions on Circuits and Systems I, vol. 51, No. 1, pp. 118-129, Jan. 2004.

* cited by examiner

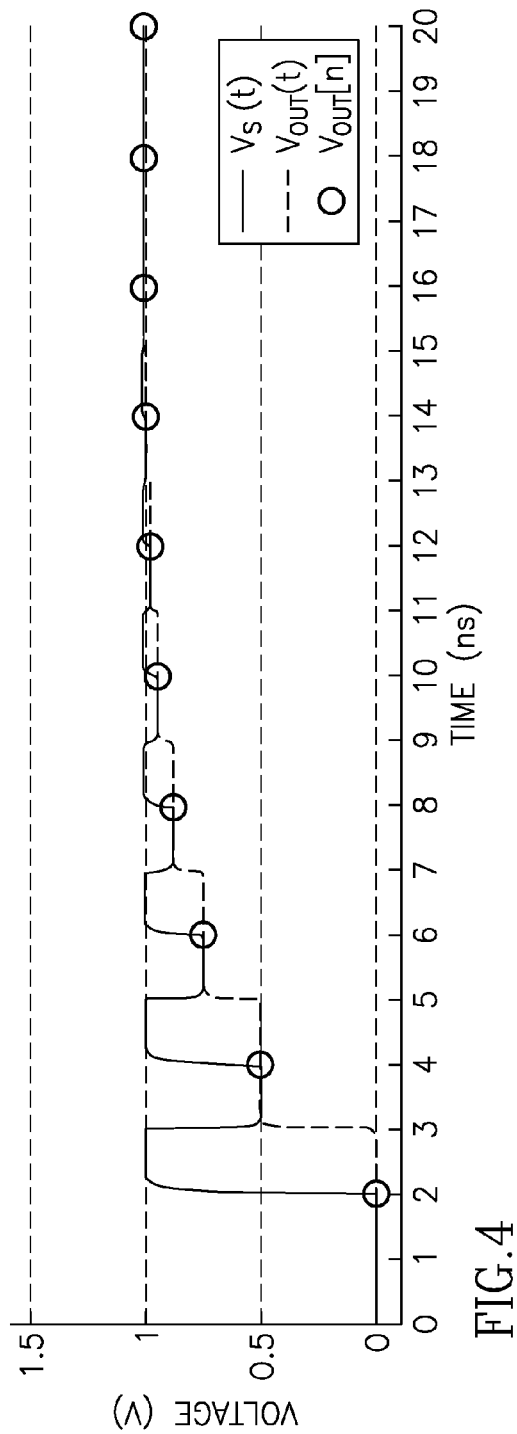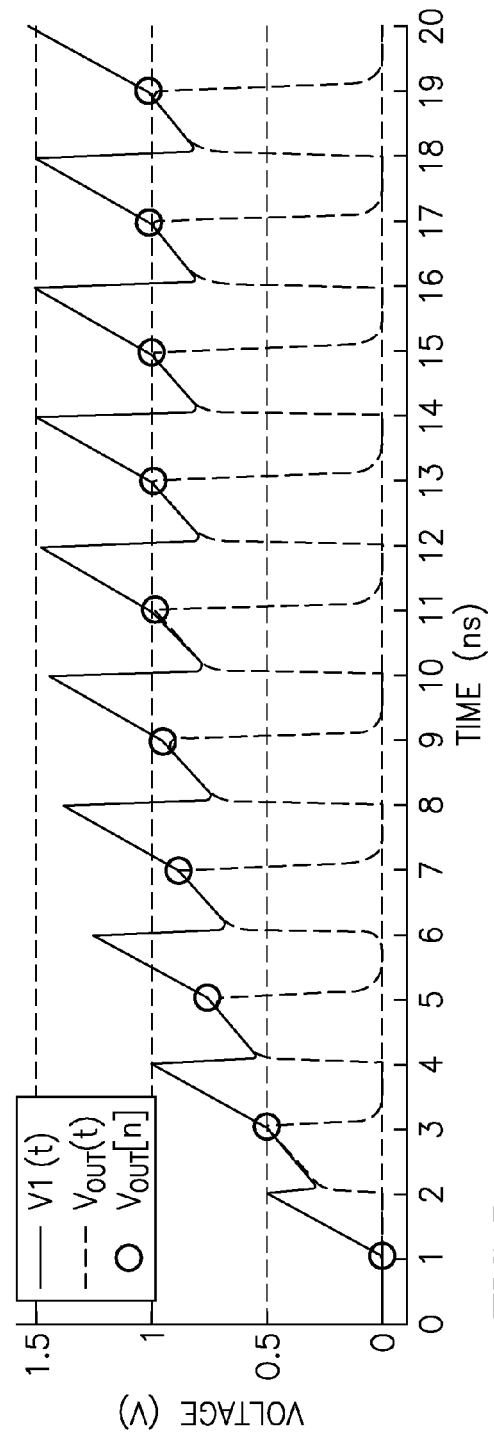

HIGH ORDER DISCRETE TIME CHARGE ROTATING PASSIVE INFINITE IMPULSE RESPONSE FILTER

REFERENCE TO PRIORITY APPLICATION

This application claims priority to U.S. Provisional Application Ser. No. 61/829,976, filed May 31, 2013, entitled "Time Domain RF Signal Processing," incorporated herein by reference in its entirety.

FIELD OF THE INVENTION

The present invention relates to the field of semiconductor integrated circuits and more particularly relates to a high order discrete time charge rotating passive infinite impulse response (IIR) filter.

BACKGROUND OF THE INVENTION

Filters are well-known in the electrical art, functioning as key building blocks in wireless communications and analog signal processing. Cellular communication devices are the largest consumer of filters. Nowadays, billions of these devices are produced every year and even a small improvement in cost and power consumption has a large impact. For example, consider a zero intermediate-frequency (zero-IF or ZIF) receiver. After reception by the antenna, a preselect filter selects a desired band (tens of MHz wide) containing the desired signal (from hundreds of kHz to several MHz wide) which is then amplified by a low noise amplifier (LNA), then downconverted by a mixer to baseband. Then, a sharp low-pass filter (LPF) selects the desired channel. The channel select filter is followed by an ADC. To relax the ADC dynamic range or the required effective number of bits (ENOB), the channel select filter usually has a high order.

There is thus a need for a passive filter that has very low power consumption to increase battery life, low noise to improve the overall noise performance of the system as well as good linearity to work properly in presence of interferer signals. Also, a high tenability is required for today's multi-mode/multi-standard radios.

SUMMARY OF THE INVENTION

A novel and useful high-order discrete-time charge rotating (CR) infinite impulse response (IIR) low-pass filter is presented. The filter utilizes capacitors and an optional $g_m$-cell, rather than operational amplifiers, and is thus compatible with digital nanoscale technology. A $7^{th}$-order charge-sampling and $6^{th}$-order voltage-sampling discrete time filter is disclosed. The order of the filter is easily extendable to higher orders. The charge rotating filter is process-scalable with Moore's law and amenable to digital nanoscale CMOS technology. Bandwidth of this filter is precise and robust to PVT variation. The filter exhibits very low power consumption per filter pole, ultra-low input-referred noise, wide tuning range, excellent linearity and low area per bandwidth and filter pole.

Design and in-depth analysis of the novel high-order discrete-time charge rotating IIR low-pass filter is provided. In one example embodiment, a 65 nm CMOS $6^{th}/7^{th}$-order filter operating at 800 MS/s sampling rate is implemented. Bandwidth of this filter is programmable between 400 kHz to 30 MHz with 100 dB maximum stop-band rejection. It has an IIP3 of +28/+21 dBm and the averaged spot noise is 3.7/3.4 nV/√Hz. It uses capacitors and a simple gm-cell, rather than op amps, thus being compatible with digital nanoscale technology. It consumes 1.7/2 mW at 1.2V and occupies 0.42 mm².

There is thus provided in accordance with the invention, a discrete time analog filter, comprising an input node for receiving an input signal, a plurality of history capacitors ($C_H$), a sampling capacitor ($C_S$) coupled to said plurality of history capacitors and operative to cyclically share charge with said plurality of history capacitors.

There is also provided in accordance with the invention, a discrete time analog filter, comprising an input node for receiving an input signal, a first history capacitor ($C_{H1}$) coupled to said input node, one or more switch banks coupled to said first history capacitor, each switch bank comprising a sampling capacitor configured to share charge with said first history capacitor, and a plurality of second history capacitors ($C_H$) coupled to and configured to share charge with the sampling capacitor in each respective switch bank.

There is further provided in accordance with the invention, a method of analog filtering in discrete time, the method comprising receiving an input signal, charging a first history capacitor with said input signal, sharing charge with a sampling capacitor coupled to said first history capacitor, and cyclically sharing charge with a plurality of second history capacitors.

There is also provided in accordance with the invention, a discrete time analog filter, comprising an input node for receiving an input signal, one or more switch banks coupled to said input signal, each switch bank comprising a first switch coupled to said input signal, a sampling capacitor coupled to said first switch and configured to share charge with a plurality of history capacitors, a plurality of second switches, each switch coupled to said sampling capacitor and to a response history capacitor, and said plurality of history capacitors ($C_H$) coupled to and configured to share charge with said sampling capacitor in a respective switch bank.

BRIEF DESCRIPTION OF THE DRAWINGS

The invention is herein described, by way of example only, with reference to the accompanying drawings, wherein:

FIG. 4 is a diagram illustrating the step response of the voltage sampling $1^{st}$ order discrete time IIR filter of FIG. 1;

FIG. 5 is a diagram illustrating the step response of the charge sampling $1^{st}$ order discrete time IIR filter of FIG. 2;

DETAILED DESCRIPTION OF THE INVENTION

Three types of analog filters include: gm-C, active RC and active switched-capacitor filters. The gm-C filter uses gm-cells and capacitors to construct a desired transfer function (TF). The bandwidth (BW) of this filter can be relatively high. In this filter, pole locations depend on $g_m$ and capacitance values. These two values are affected independently by process, voltage and temperature (PVT) variations and cause considerable variation in bandwidth and transfer function of the filter. Hence, the filter requires a calibration mechanism running periodically or in the background. This makes the filter quite complicated with power and area disadvantages. This filter also features low to moderate linearity.

An active RC filter can have relatively high linearity. In this type of filter, pole locations are set by resistor and capacitor values. Since these two are also sensitive to process and temperature variations and do not track each other, this type of filter also requires calibration. An active switched-capacitor filter that does not have this problem has pole locations set by the capacitor ratio that is very accurate and independent from PVT variation in monolithic implementations. This filter, however, dissipates significant amount of power in the operational amplifiers (op amps) to ensure a good settling. Also, its sampling rate is limited by speed of the op amps. Thus, it typically cannot achieve a very high bandwidth.

Both the active RC and switched-capacitor filters need a very carefully designed active analog component. In a gm-C filter, a very linear gm-cell with high swing and low noise is required. Active RC and active switched-capacitor filters need a fast-settling op amp with high gain. By scaling down CMOS process technology to deep nanoscale, it is becoming more difficult to design and implement such an active analog component. This is mainly due a lower voltage headroom and lower MOS intrinsic gain.

In another embodiment, a discrete-time (DT) passive analog signal processing technique avoids the aforementioned problems. Passive discrete time FIR/IIR filters using switched-capacitor techniques are used for baseband signal processing and channel selection of an RF receiver. High order discrete time passive filtering is used based on a rotating switched-capacitor topology that offers excellent noise, linearity and very low power consumption.

Figure 1:
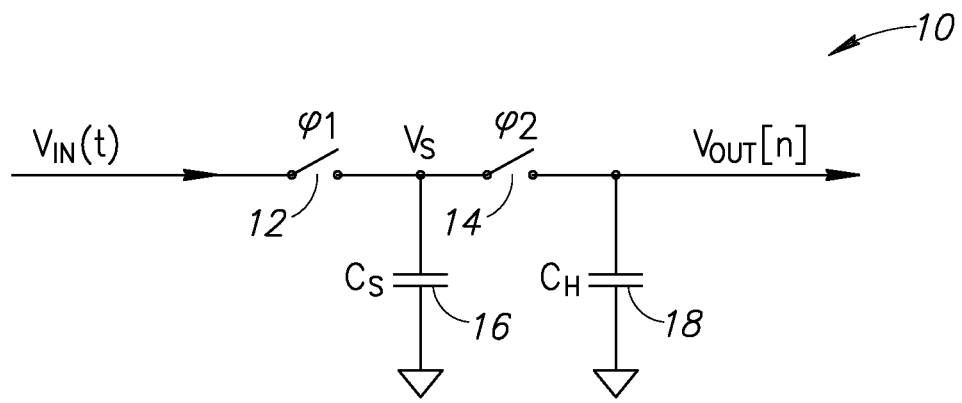
FIG. 1 is a schematic diagram illustrating an example voltage sampling $1^{st}$ order discrete time IIR filter.
Figure 3:
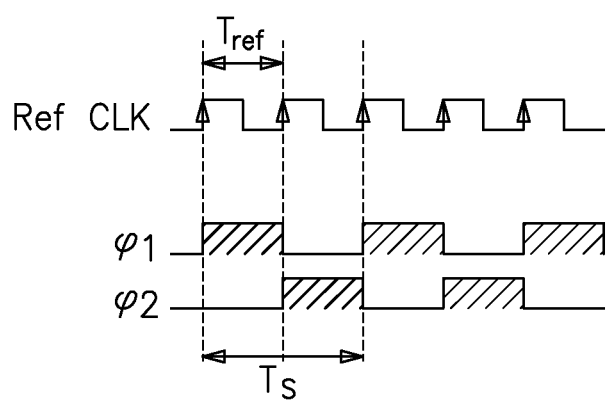
FIG. 3 is a diagram illustrating clock waveforms of the circuits of FIGS. 1 and 2.

Basic discrete time IIR low-pass filter structures are described below followed by an example high-order filter. The description begins with first order filters. The simplest analog discrete-time (DT) filter is a passive first-order IIR low-pass filter as shown in FIG. 1. In each cycle at φ1 a sampling capacitor $C_S$ 16 samples a continuous-time input voltage $V_{in}(t)$. Hence, we call it a voltage sampling filter. Then at φ2, $C_S$ shares its stored charge with a history capacitor $C_H$ 18. At the end of φ2, we have the following equation for the output voltage $$V_{out}[n] = \frac{C_H}{C_H + C_S} V_{out}[n-1] + \frac{C_S}{C_H + C_S} V_{in}[n-0.5] \quad (1)$$

where n is a sample number. Hence, its transfer function can be written in the z-domain as $$\frac{V_{out}(z)}{V_{in}(z)} = \frac{(1-\alpha)z^{-0.5}}{1-\alpha z^{-1}} \quad (2)$$

where α is $C_H/(C_H+C_S)$. This is a standard form of a discrete time low-pass filter (LPF) with unit dc gain and half-a-cycle delay. Switch driving clock waveforms are shown in FIG. 3.

The step response of this filter is shown in FIG. 4. $C_S$ and $C_H$ are chosen to be 1 pF each for illustration purposes only. Discrete-time output samples are available in each cycle at the end of φ2. At first, suppose that both $C_S$ and $C_H$ are empty of charge. Then, the input step comes at the time of 1 ns. Next in φ1, $C_S$ samples the input voltage and at 2 ns is charged to a 1V potential. Then in φ2, it shares its charge with $C_H$. As $C_S$ and $C_H$ have equal capacitance in this example, the first output sample becomes 0.5V at 4 ns. In the next cycle, $C_S$ is again charged to 1V and when it is connected to $C_H$ at φ2, the next output sample reaches 0.5V+0.25V=0.75V. This process continues in subsequent cycles as depicted.

Figure 2:
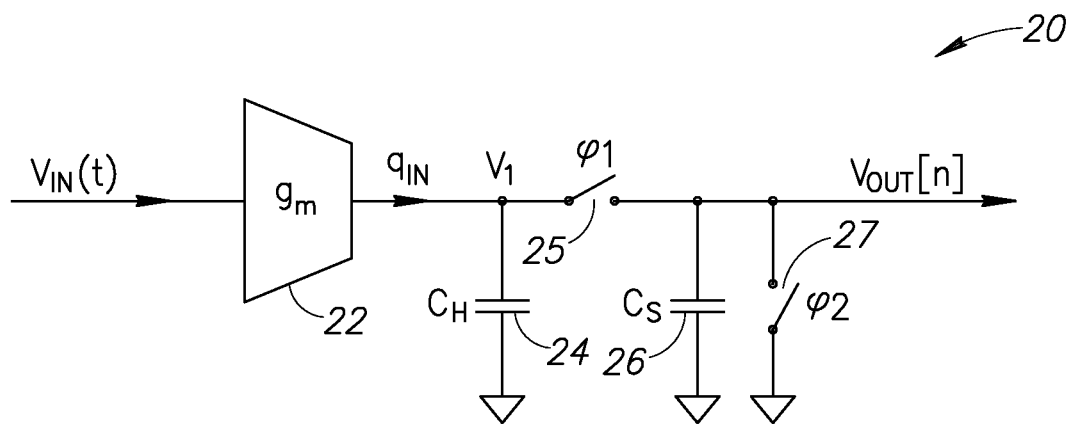
FIG. 2 is a schematic diagram illustrating an example charge sampling $1^{st}$ order discrete time IIR filter.

FIG. 2 shows an alternative $1^{st}$-order discrete time low pass filter (LPF) (referred to as IIR1) that exploits charge sampling. At first, the continuous-time input voltage is converted into current by a gm-cell 22. This current is integrated over a time window on $C_H$ 24 and $C_S$ 26. Hence, we can consider a discrete-time input charge packet arriving every cycle at φ1

$$q_{in}[n] = \int_{(n-1)T_s}^{nT_s} g_m V_{in}(t) \cdot dt \tag{3}$$

where $T_s$, is the sampling period. At this phase, $C_S$ samples a part of input charge and the $C_H$ charge. Consequently, we have the discrete time (DT) output samples at the end of φ1

$$V_{out}[n] = \frac{C_H}{C_H + C_S} V_{out}[n-1] + \frac{1}{C_H + C_S} q_{in}[n] \tag{4}$$

$$\frac{V_{out}(z)}{q_{in}(z)} = \frac{1}{C_S} \times \frac{1-\alpha}{1-\alpha z^{-1}} \tag{5}$$

The step response of this filter is shown in FIG. 5. In this example, $C_S$ and $C_H$ are 1 pF and $g_m$ is 0.5 mS. At first, suppose that voltage at $C_H$ 24 is zero. The input step voltage appears at 1 ns and causes a constant 0.5 mA current from the gm-cell 22. This current is integrated on $C_H$ during φ2. Also at this time, $C_S$ 26 is reset to zero. Then, at φ1, $C_H$ is connected to $C_S$ thus sharing its charge. During φ1, the input current is integrated on both capacitors. At the end of φ1 (i.e. at 3 ns) an output sample of 0.5V is generated. Likewise, it is transferred to the subsequent cycles thus producing 0.75V, 0.875, etc., as output samples. Although the assumption applied in (3) changes the transient waveforms of FIG. 5 slightly, it leads to exactly the same values of the output samples while simplifying the analysis of the filter.

In the above two structures $C_S$ behaves like a lossy component that leaks a time-averaged current from $C_H$ to ground. We might call it a DT resistor (also referred to as a switched-capacitor resistor). This resistor in parallel with the capacitor makes a first order low-pass filter.

Figure 6:
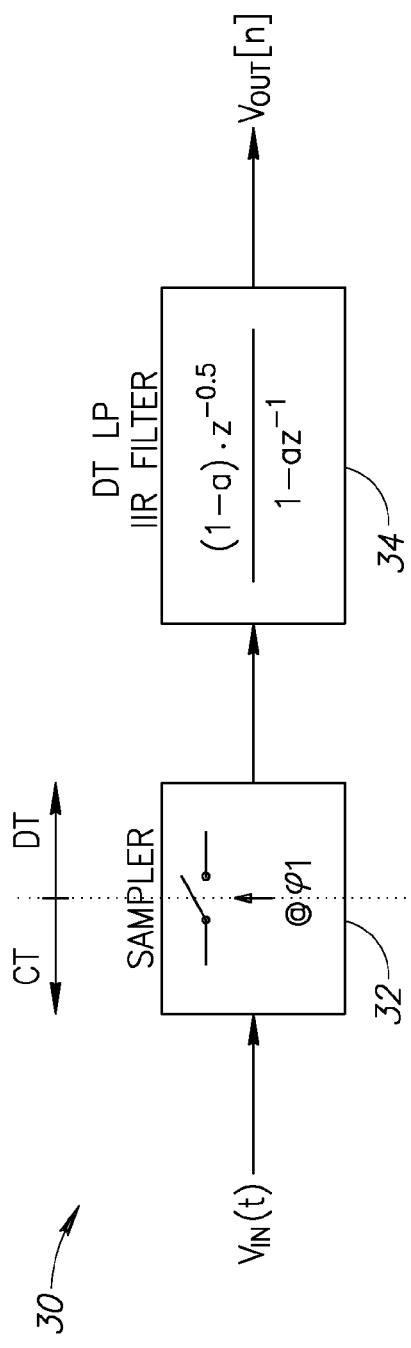
FIG. 6 is a block diagram illustrating a model of voltage sampling IIR1.
Figure 8:
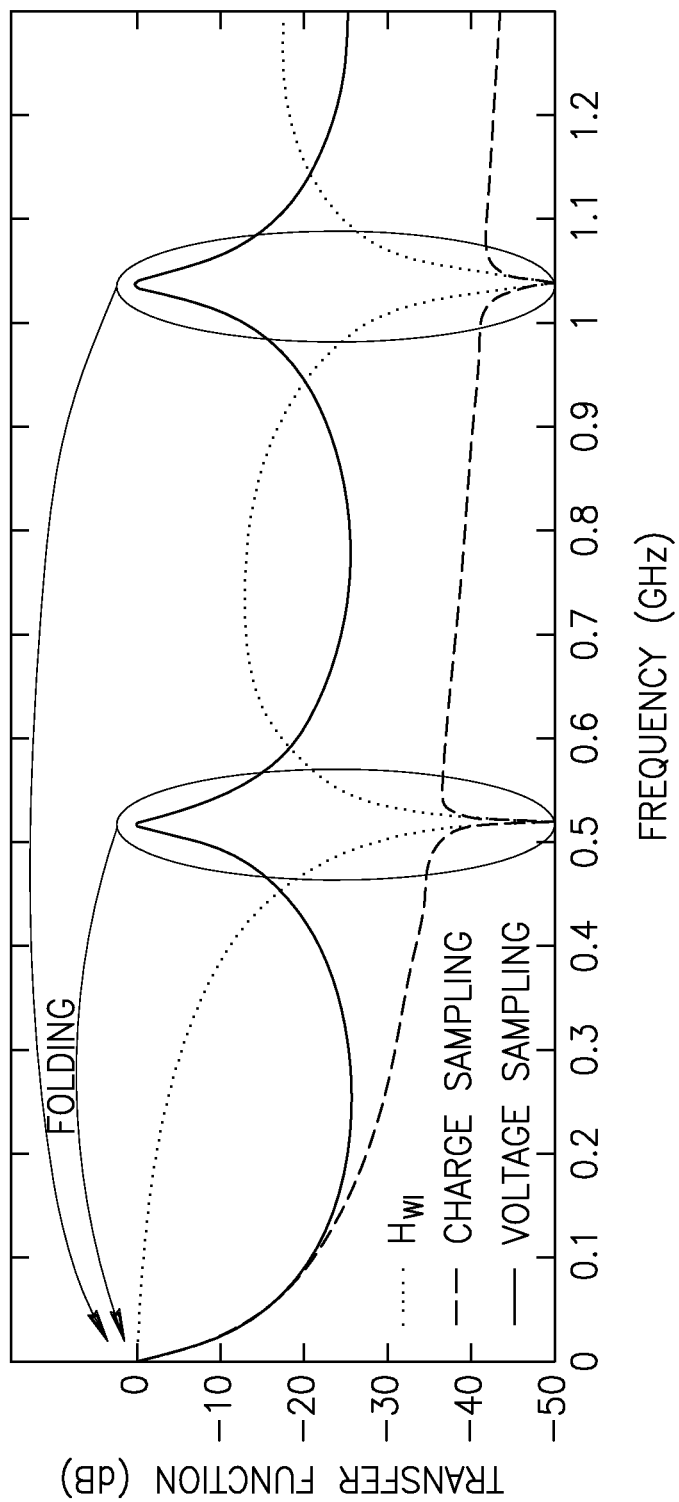
FIG. 8 is a diagram illustrating a wideband transfer function of IIR1.
Figure 9:
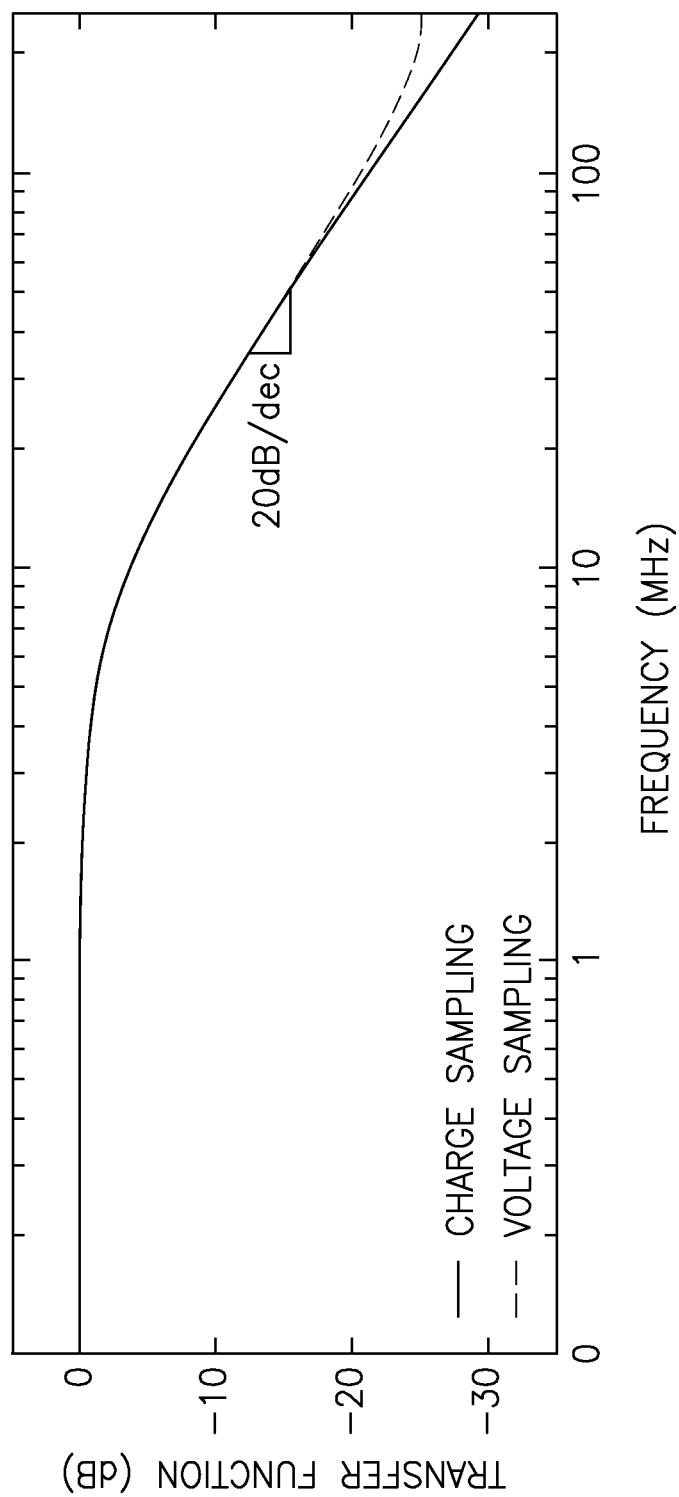
FIG. 9 is a diagram illustrating a Bode plot frequency response of IIR1.

A block diagram illustrating a model of voltage sampling IIR1 shown in FIG. 6. A block diagram illustrating a model of charge sampling IIR1 shown in FIG. 7. In the voltage-sampling structure of FIG. 6, the sampler 32 first samples the continuous-time (CT) analog input voltage $V_{in}(t)$ at φ1 and converts it into a DT analog voltage. Then, this signal is fed to a first-order LPF 34 with half-a-cycle delay ($z^{-0.5}$) and the output comes out every cycle at φ2. The dc voltage gain of this filter is unity. Based on the Nyquist sampling theory, sampling of a CT signal folds frequencies around $k \times f_s$ (for k=1, 2, 3 ...) into around dc, where $f_s$ is the sampling frequency. As shown in FIG. 8 which plots the wideband frequency response of the voltage-sampling DT filter, we observe the folding image frequencies at $f_s$, $2f_s$ and so on. FIG. 9 shows the Bode plot of this transfer function, which has a roll-off of 20 dB/dec.

Figure 7:
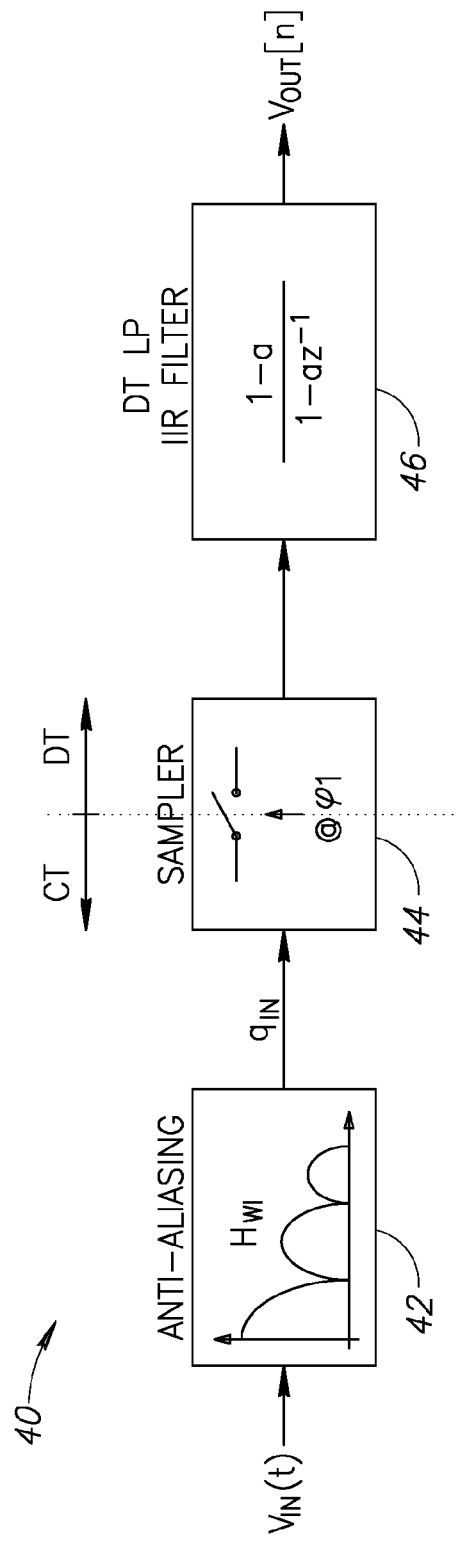
FIG. 7 is a block diagram illustrating a model of charge sampling IIR1.

An example behavioral model of the IIR1 filter incorporating charge sampling is shown in FIG. 7. Integration of the gm-cell current in the time window, as described in (3), forms a CT sinc-type antialiasing filter prior to sampling. The transfer function of this window integration from the input voltage to the output charge is $$H_{WI}(f) = g_m T_s \times \frac{\sin(\pi f T_s)}{\pi f T_s} \tag{6}$$

This sinc-shape filter has notch frequencies located at $k/T_i$ (k=1, 2, 3, ...). In this case with ideal clock waveforms, $T_i$ is the same as $T_s=1/f_s$. In a next step, the sampler converts the CT signal to a DT signal and, at the end, a $1^{st}$-order DT LPF preforms the main filtering. As shown in FIG. 8, notch frequencies of the antialiasing filter are on top of the folding image frequencies. Therefore, a signal at these frequencies is attenuated by the CT sinc filter before folding to dc. The dc voltage gain of this filter is calculated by multiplying the dc gain of the antialiasing filter by the dc gain of the DT filter $$A_V = \frac{V_{out}}{V_{in}} = g_m T_i \times \frac{1}{C_S} = g_m \times \frac{1}{C_S f_s} \tag{7}$$

In this equation, $1/(C_S f_s)$ is an equivalent DT resistance of the sampling capacitor.

The charge sampling structure has several additional advantages compared to the voltage sampling structure. As discussed, the current integration forms a CT antialiasing filter, which suppresses the folding of images. Also, with the gm-cell used in the charge sampling structure, the filter can have an overall voltage gain higher than unity. In addition, this gm-cell can be designed to lower the overall input-referred noise of the filter. These advantages, however, come at the cost of a higher power consumption and a lower linearity imposed by the gm-cell.

Figure 10:
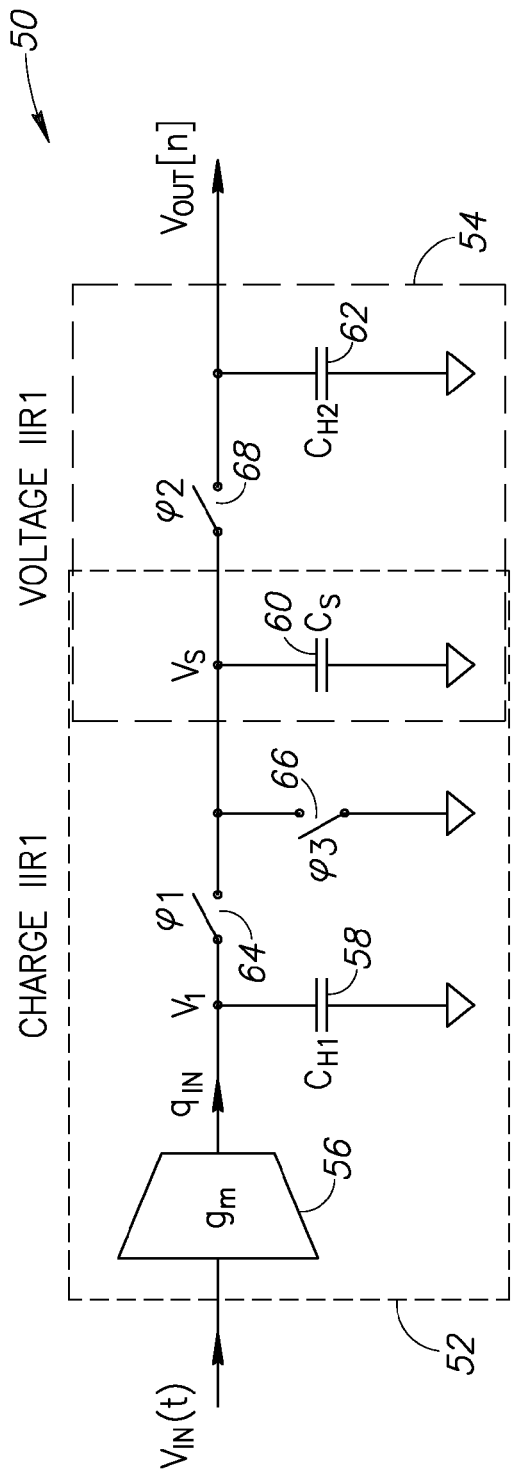
FIG. 10 is a schematic diagram illustrating an example second order discrete time low pass filter.
Figure 11:
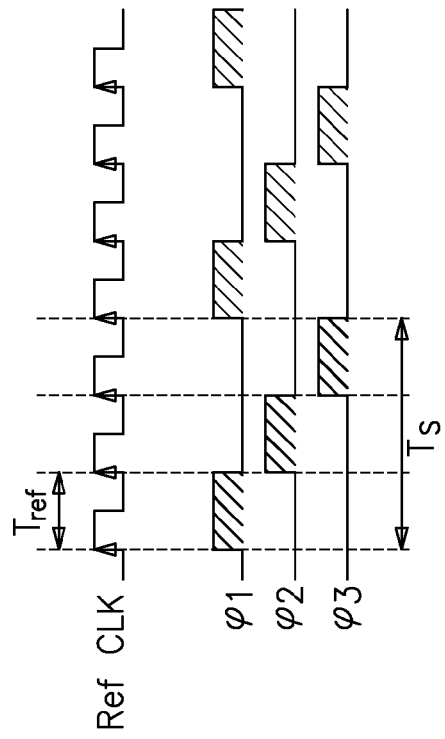
FIG. 11 is a diagram illustrating the clock waveforms of the low pass filter of FIG. 10.

A second-order DT low-pass filter (referred to as IIR2) can be synthesized by adding a second history capacitor to the charge sampling $1^{st}$-order LPF, as shown in FIG. 10. A diagram illustrating the clock waveforms of the low pass filter of FIG. 10 shown in FIG. 11. The previously analyzed charge sampling filter, IIR1, is indicated here within the dotted box 52 incorporating first history capacitor $C_{H1}$. At the end of φ1, charge sharing capacitor $C_S$ 60 contains the output sample of the IIR1. Then, by connecting this sampling capacitor to a second history capacitor $C_{H2}$ 62 at φ2, another $1^{st}$-order LPF is formed, whose structure is indicated within the dashed box 54 in FIG. 10. This IIR2 filter operates similar to the voltage-sampling IIR1 filter of FIG. 1. Then at φ3, remaining history of $C_S$ is cleared by discharging it to ground. This ensures proper operation of the first IIR1.

In this filter, the voltage-sampling IIR1 is cascaded with the charge-sampling one, raising the total order of the filter to the $2^{nd}$-order. It is noted that cascading two CT conventional filter stages without any loading effect would require an active buffer to isolate the first stage from the second stage. In contrast, in the DT filter of FIG. 10 there is an inherent reverse isolation between the stages through a time-slot separation (i.e. time-division duplexing), which does not require a separate active buffer. This is due to the time switching sequence and reset of $C_S$ at the end of each cycle. In this way, the charge is only transferred from left to right and, therefore, we obtain the reverse isolation. This is a key feature in the DT switched-capacitor filter synthesis.

Charge sharing equations of this filter at the end of φ2 are $$\begin{cases} V_{out}[n] = \dfrac{C_{H2}}{C_{H2}+C_S} V_{out}[n-1] + \dfrac{C_S}{C_{H2}+C_S} V_1\left[n-\dfrac{1}{3}\right] \\ V_1\left[n-\dfrac{1}{3}\right] = \dfrac{C_{H1}}{C_{H1}+C_S} V_1\left[n-\dfrac{1}{3}-1\right] + \dfrac{1}{C_{H1}+C_S} q_{in}\left[n-\dfrac{1}{3}\right] \end{cases} \quad (8)$$

which generates the filter transfer function $$\dfrac{V_{out}}{q_{in}} = \dfrac{1}{C_S} \cdot \left( \dfrac{1-\alpha_1}{1-\alpha_1 z^{-1}} \times \dfrac{(1-\alpha_2)z^{-\frac{1}{3}}}{1-\alpha_2 z^{-1}} \right) \quad (9)$$

where $\alpha_{1,2} = C_{H1,2}/(C_{H1,2}+C_S)$. Hence, the overall dc voltage gain of this filter is given by $$A_V = \dfrac{V_{out}}{V_{in}} = g_m T_i \times \dfrac{1}{C_S} = g_m \times \dfrac{1}{C_S f_s} \quad (10)$$

which is the same as the charge-sampling IIR1 in (7).

Figure 12:
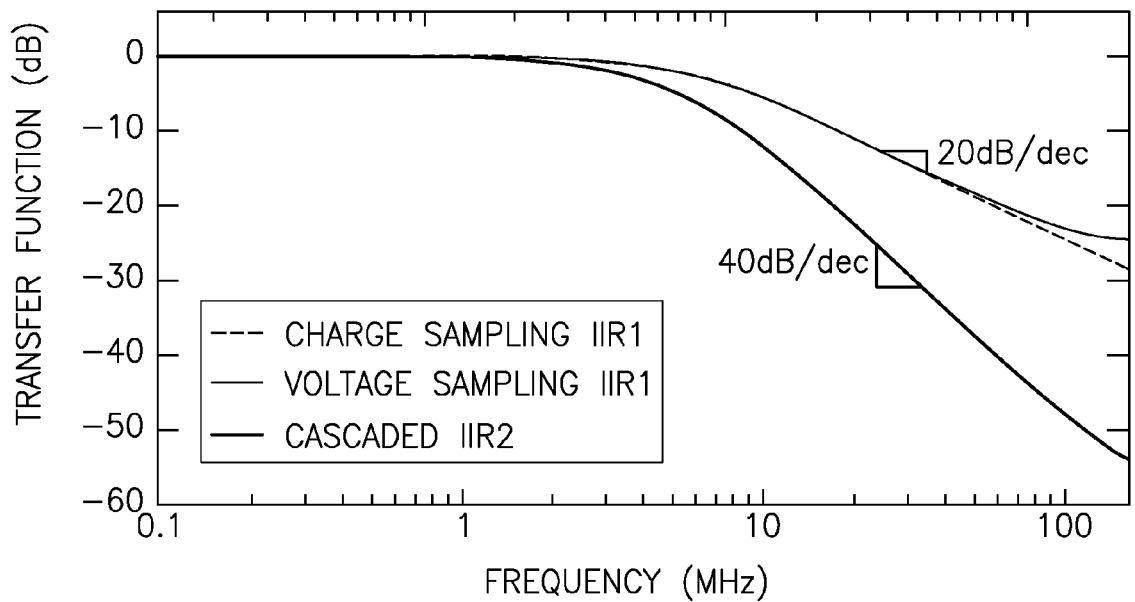
FIG. 12 is a diagram illustrating the frequency response of the IIR2 filter.

The transfer function of this filter is plotted in FIG. 12. The $2^{nd}$-order IIR filter has a steeper slope of 40 dB/dec compared to the IIR1 with 20 dB/dec.

Figure 14:
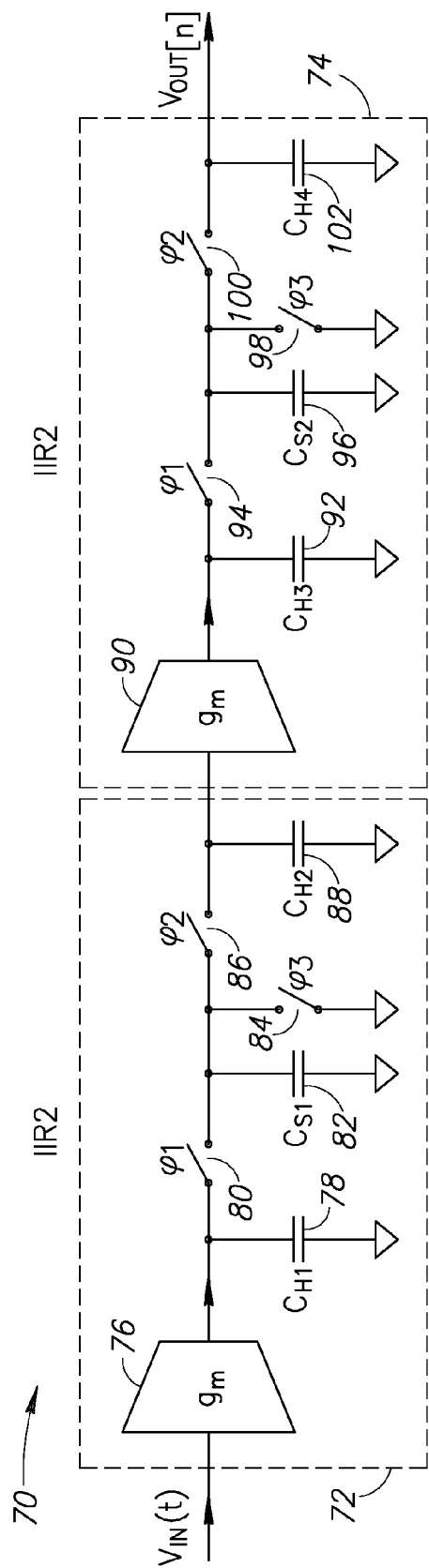
FIG. 14 is a schematic diagram illustrating an example $4^{th}$-order filter.

Many applications require higher orders of filtering. One technique is to build a high-order filter by cascading two or more first and/or second-order filters. FIG. 14 shows a $4^{th}$-order filter synthesized by cascading two identical IIR2 filter stages.

Figure 13:
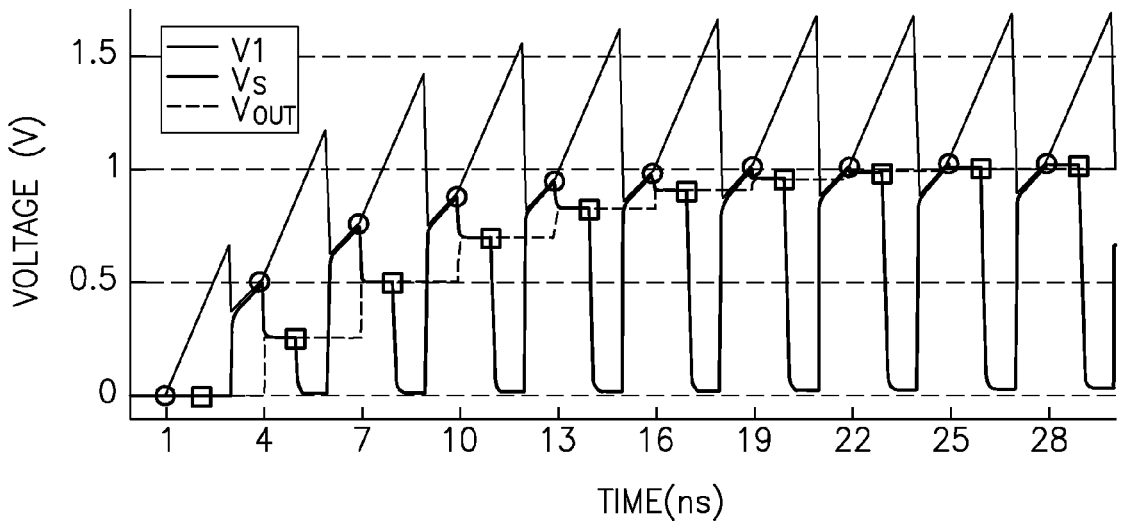
FIG. 13 is a diagram illustrating the step response of the IIR2 filter.

As plotted in FIG. 13, the output of the first IIR2 block 72 has a step-like waveform in the continuous-time domain. $C_{H2}$ 88 in this stage holds its DT output until the next output sample arrives. Hence, we can suppose that the zero-order hold (ZOH) discrete-time to continuous-time converter makes a CT voltage signal at the output of this stage. Then, this signal is converted into current by the second $g_m$ stage 90. This current is integrated over a time window and sampled to form a DT input charge $q_{in}[n]$ of the second IIR2 block 74. This whole process can be modeled as a DT gain with a value of $g_m \times T_s$. Then, the switched-capacitor filter of the second IIR2 preforms another second order filtering and thus we obtain the $4^{th}$-order filter in total.

This structure, however, consumes more power as compared to a single IIR2 filter. Likewise, linearity is worse because nonlinearities of the first and second IIR2 filters are added together. As an example, if the first stage has a gain higher that 0 dB, the input-referred nonlinearity of the second stage is dominant and degrades the total linearity. Similarly, the total input-referred noise of this filter is higher than with a single IIR2. This is due to the fact that both IIR2 filters contribute to noise of the system. If the first stage has a gain higher than 0 dB, however, it reduces the input-referred noise contribution of the second stage.

Figure 15:
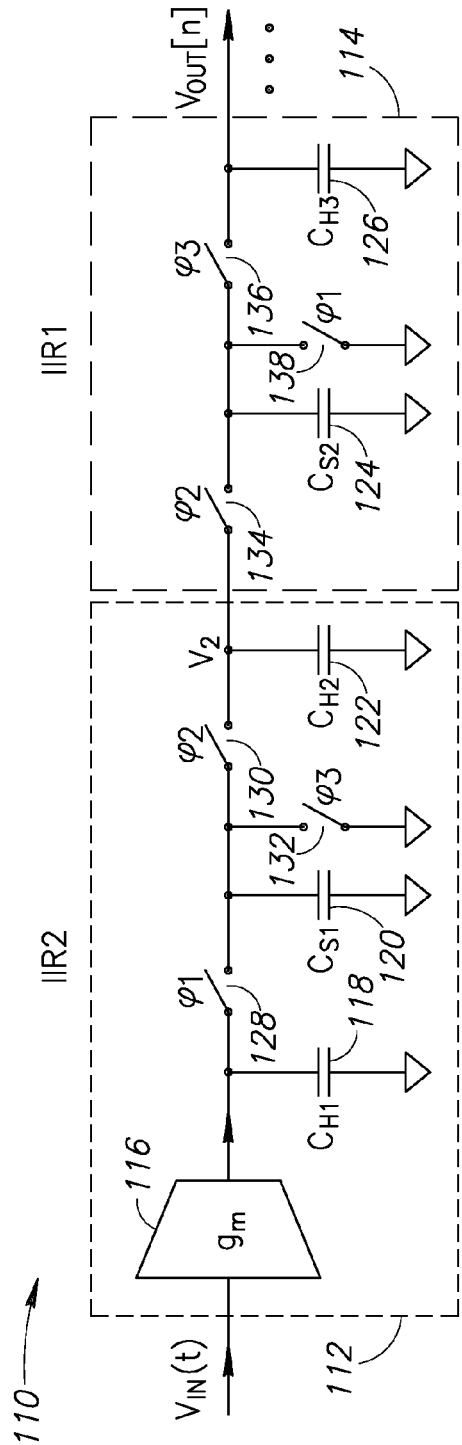
FIG. 15 is a schematic diagram illustrating an example $3^{rd}$-order filter.

In another embodiment, the filter order is increased by cascading the IIR2 filter with a passive $1^{st}$-order switched-capacitor filter. FIG. 15 shows this technique in which a $3^{rd}$-order filter, generally referenced 110, is synthesized by cascading the IIR2 block 112 and an IIR1 block 114. This filter operates as follows: At the end of φ1, $C_{S1}$ 120 holds the sample of first-order filtered signal. Then at φ2, it is connected to $C_{H2}$ 122 to perform charge-sharing. At the same time, a second sampling capacitor $C_{S2}$ 124 that was empty before, is also connected to $C_{H2}$ to resample the result of the second-order filtering. Therefore, $C_{S1}$ shares its charge with both $C_{H2}$ and $C_{S2}$ 124. Subsequently at φ3, $C_{S2}$ 124 that contains the sample of the IIR2 112, shares its charge with a third history capacitor $C_{H3}$ 126. This sharing makes another $1^{st}$-order IIR filtering, which is cascaded with the previous IIR2, thus giving rise to the $3^{rd}$-order filtering. To have proper cascading of the IIR2 and IIR1, we require a reverse isolation between them. Hence, at φ1 of the next cycle, $C_{S2}$ is discharged to zero to clear its remaining charge. This way, is does not transfer any charge back to $C_{H2}$ at φ2. The cascaded $1^{st}$-order filter is indicated with dotted line at the right side of FIG. 15. Note that several of the IIR1 blocks 114 can be cascaded to achieve higher orders. Charge transfer equations of this filter at the end of φ3 are as follows $$\begin{cases} V_{out}[n] = \dfrac{C_{H3}}{C_{H3}+C_{S2}} V_{out}[n-1] + \dfrac{C_{S2}}{C_{H3}+C_{S2}} V_2\left[n-\dfrac{1}{3}\right] \\ V_2\left[n-\dfrac{1}{3}\right] = \dfrac{C_{H2}}{C_{H2}+C_{S1}+C_{S2}} V_2\left[n-\dfrac{1}{3}-1\right] + \\ \qquad\qquad\qquad \dfrac{C_{S1}}{C_{H2}+C_{S1}+C_{S2}} V_1\left[n-\dfrac{2}{3}\right] \\ V_1\left[n-\dfrac{2}{3}\right] = \dfrac{C_{H1}}{C_{H1}+C_{S1}} V_1\left[n-\dfrac{2}{3}-1\right] + \dfrac{1}{C_{H1}+C_{S1}} q_{in}[n] \end{cases} \quad (11)$$

Then we can derive the transfer function as $$\begin{aligned} \dfrac{V_{out}}{q_{in}} &= \left( \dfrac{1}{C_{S1}} \times \dfrac{1-\alpha_1}{1-\alpha_1 z^{-1}} \right) \cdot \\ &\quad \left( \dfrac{C_{S1}}{C_{S1}+C_{S2}} \times \dfrac{(1-\alpha_2) z^{-\frac{1}{3}}}{1-\alpha_2 z^{-1}} \right) \cdot \left( \dfrac{(1-\alpha_3) z^{-\frac{1}{3}}}{1-\alpha_3 z^{-1}} \right) \\ &= \dfrac{1}{C_{S1}+C_{S2}} \cdot \left( \dfrac{1-\alpha_1}{1-\alpha_1 z^{-1}} \times \dfrac{1-\alpha_2}{1-\alpha_2 z^{-1}} \times \dfrac{1-\alpha_3}{1-\alpha_3 z^{-1}} \times z^{-\frac{2}{3}} \right) \end{aligned} \quad (12)$$

where $$\alpha_1 = \dfrac{C_{H1}}{C_{H1}+C_{S1}}, \; \alpha_2 = \dfrac{C_{H2}}{C_{H2}+C_{S1}+C_{S2}}, \; \alpha_3 = \dfrac{C_{H3}}{C_{H3}+C_{S2}} \quad (13)$$

The main drawback of this structure is gain loss. Comparing this $3^{rd}$-order filter with the IIR2, there it a lower dc gain because of the second sampling capacitor $C_{S2}$. It leaks part of the system charge to ground in addition to the resetting of $C_{S1}$ and, therefore, introduces more loss. Comparing (9) and (12) reveals a dc gain difference of these two structures. Input-referred noise of this structure is also higher versus that of IIR2. Firstly, because of extra noise of the IIR1 part in FIG. 14. Secondly, because of the lowered gain of its preceding stage. In contrast, linearity of the filter is almost the same because the switched-capacitor circuit cascaded with IIR2 is extremely linear compared to the gm-cell active circuitry. Hence, it does not significantly degrade the linearity.

The above reasoning makes it apparent that extending the IIR filter order using a conventional approach carries two serious disadvantages: First, the increased reset-induced charge loss lowers the gain and signal-to-noise ratio. Second, the active buffers between the stages worsen both the noise and the linearity. An alternative embodiment incorporating charge rotation is presented infra that does not suffer from these two handicaps.

Figure 16:
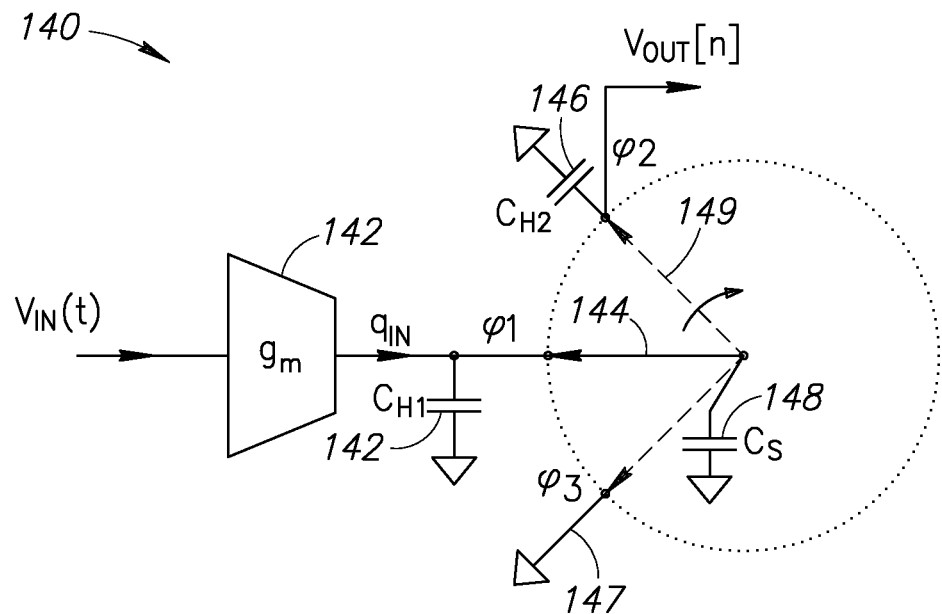
FIG. 16 is a schematic diagram illustrating the IIR2 redrawn.

Before introducing the high-order filter embodiment, the IIR2 block is redrawn in FIG. 16. A closed switch is shown with a solid arrow 144, and an open switch is shown with a dimmed dashed arrow 149. Also, $C_S$ 148 is placed at the center of the (incomplete) circle. In each cycle, $C_S$ "rotates" clockwise and sequentially connects to $C_{H1}$ 142, $C_{H2}$ 146 and then ground 147. As described earlier, at the end of $\phi 1$, $C_S$ holds a sample of first order filter. Then, at the next phase, $\phi 2$, $C_S$ shares its charge with the second history capacitor $C_{H2}$. At the end of this phase, the output sample of the $2^{nd}$-order IIR filter on $C_{H2}$ is ready for readout. At the same time, we have the output sample of this IIR2 on $C_S$. It is important to note that we can maintain this sample on $C_S$ for further processing before finally resetting it at the end of the entire cycle (i.e. $\phi 3$ in this example).

Figure 17A:
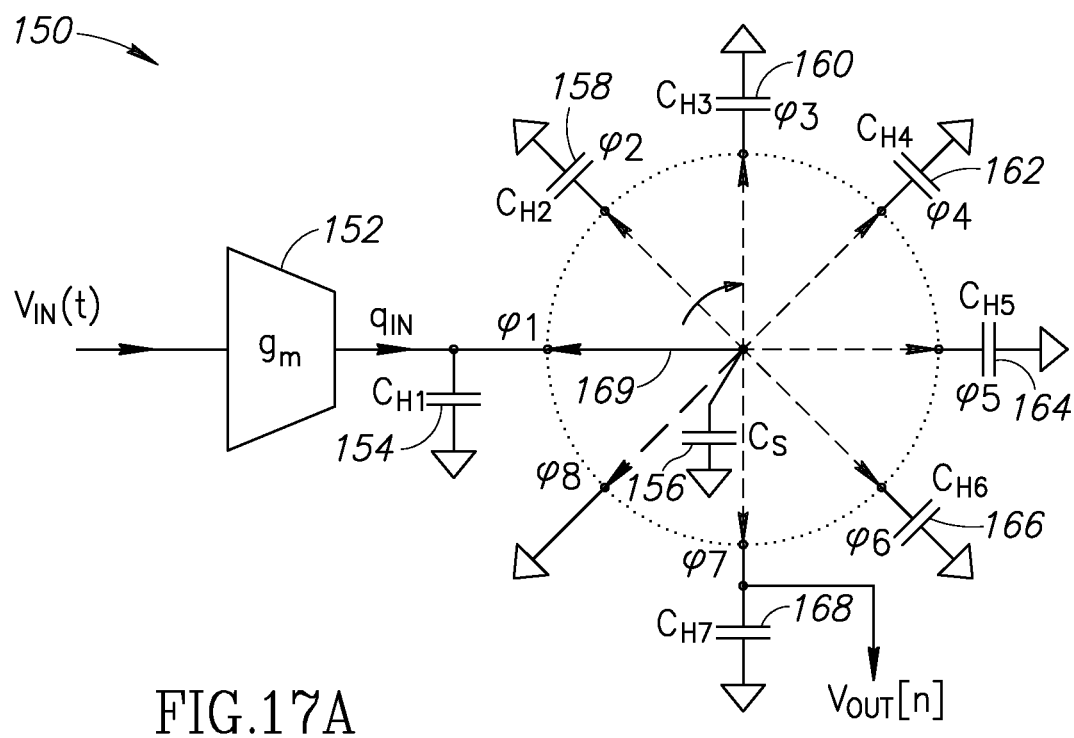
FIG. 17A is a schematic diagram illustrating an example charge rotating $7^{th}$-order filter.
Figure 17B:
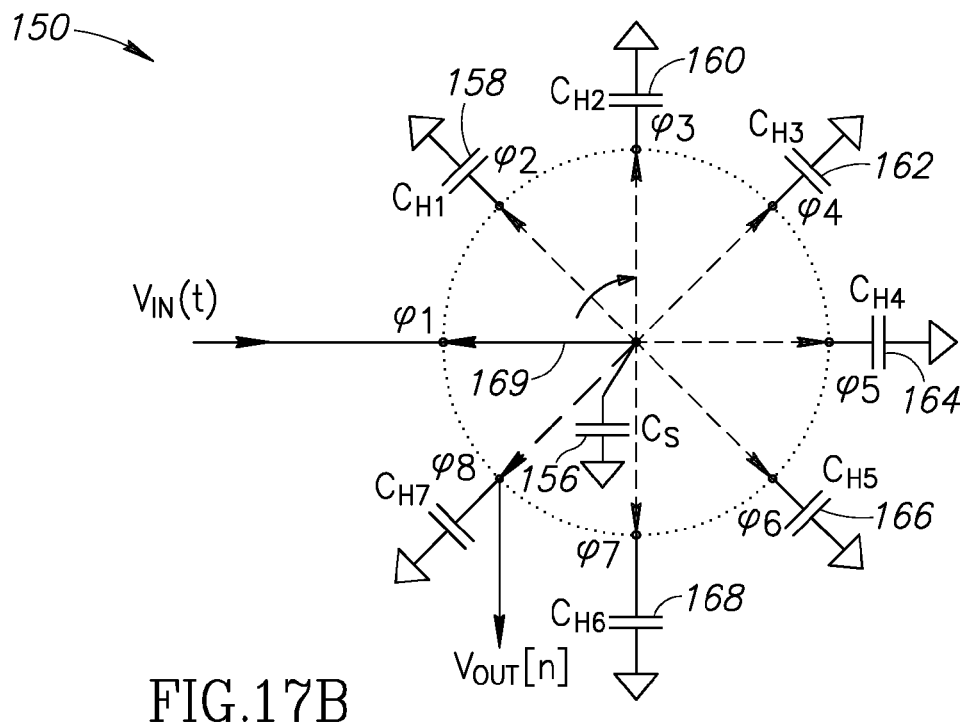
FIG. 17B is a schematic diagram illustrating an example charge rotating $7^{th}$-order filter in voltage sampling mode.

This technique can be extended by adding one or more phase slots between $\phi 2$ and the last reset phase, together with additional associated history capacitors. An example high-order filter structure ($7^{th}$ order) is shown in FIG. 17A. An example high-order filter structure ($7^{th}$ order) in voltage sampling mode is shown in FIG. 17B. By moving to the next new phase, $\phi 3$, $C_S$ 156 which now holds the sample of the $2^{nd}$-order filter, shares its charge with a third history capacitor $C_{H3}$. This charge sharing creates another IIR1, cascaded with the previous IIR2. Hence, we have a $3^{rd}$-order filtering function on $C_{H3}$ 160 that can be read out at the end of $\phi 3$. Again, $C_S$ contains the sample of this $3^{rd}$-order filter at the end of this phase. Next, by continuing with $\phi 4$, $C_S$ shares its charge with $C_{H4}$ 162 creating yet another IIR1. The $4^{th}$-order output is available for readout at the end of $\phi 4$. We can continue doing so until the seventh history capacitor $C_{H7}$ 168 resulting in a $7^{th}$-order filter. One may continue adding phases and history capacitors to realize higher orders.

Figure 18:
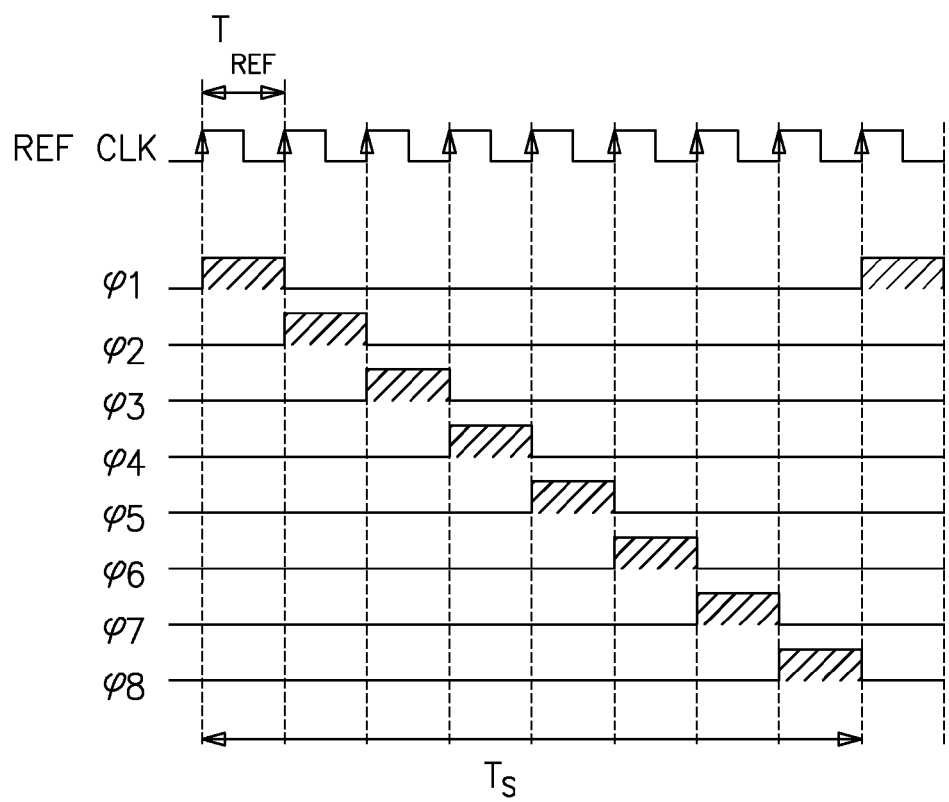
FIG. 18 is a diagram illustrating the clock waveforms of the low pass filter of FIGS. 17A and 17B.

In the last phase $\phi 8$, $C_S$ is finally connected to ground to empty its remaining charge. Thus, it is ready for the next complete cycle. Since the $C_S$ capacitor rotates charge between the history capacitors, this structure is referred to as a "charge rotating" discrete time filter. Each of the history capacitors can be considered an output of the filter with different orders. The output with the highest order $C_H$, however, is typically used ($C_{H7}$ in this example). As shown in FIG. 18 the required multiphase clock waveforms to drive the switches can be generated from a reference clock.

Appropriate cascading of seven $1^{st}$-order IIR filters in this structure requires reverse isolation between them. This reverse isolation is provided by rotating $C_S$ located at the center of the structure only in one direction (i.e. clockwise here). Also, the resetting phase at the end of each cycle is necessary to prevent transferring charge from the last stage $C_{H7}$ to the first stage at the next cycle.

Compared to the IIR2 structure in FIG. 10, the charge rotating (CR) structure preserves its gain, linearity and noise even at much higher orders. In contrast with the $3^{rd}$-order filter in FIG. 15, the charge rotating IIR filter preserves the same DC gain as IIR2 even at the $7^{th}$-order configuration (i.e. IIR7). This is simply because no additional charge loss occurs in the system. Similar as in IIR2, it has only one lossy component, the $C_S$ capacitor that is reset once each cycle. The switched-capacitor charge rotating structure circuit is remarkably linear and thus the gm-cell appears to be a bottleneck of the linearity. Since the gm-cell used in the charge rotating IIR7 is the same as in IIR2, the linearity is almost the same. Also, the charge rotating filter has the same noise as IIR2 which is discussed in more detail infra.

Figure 19:
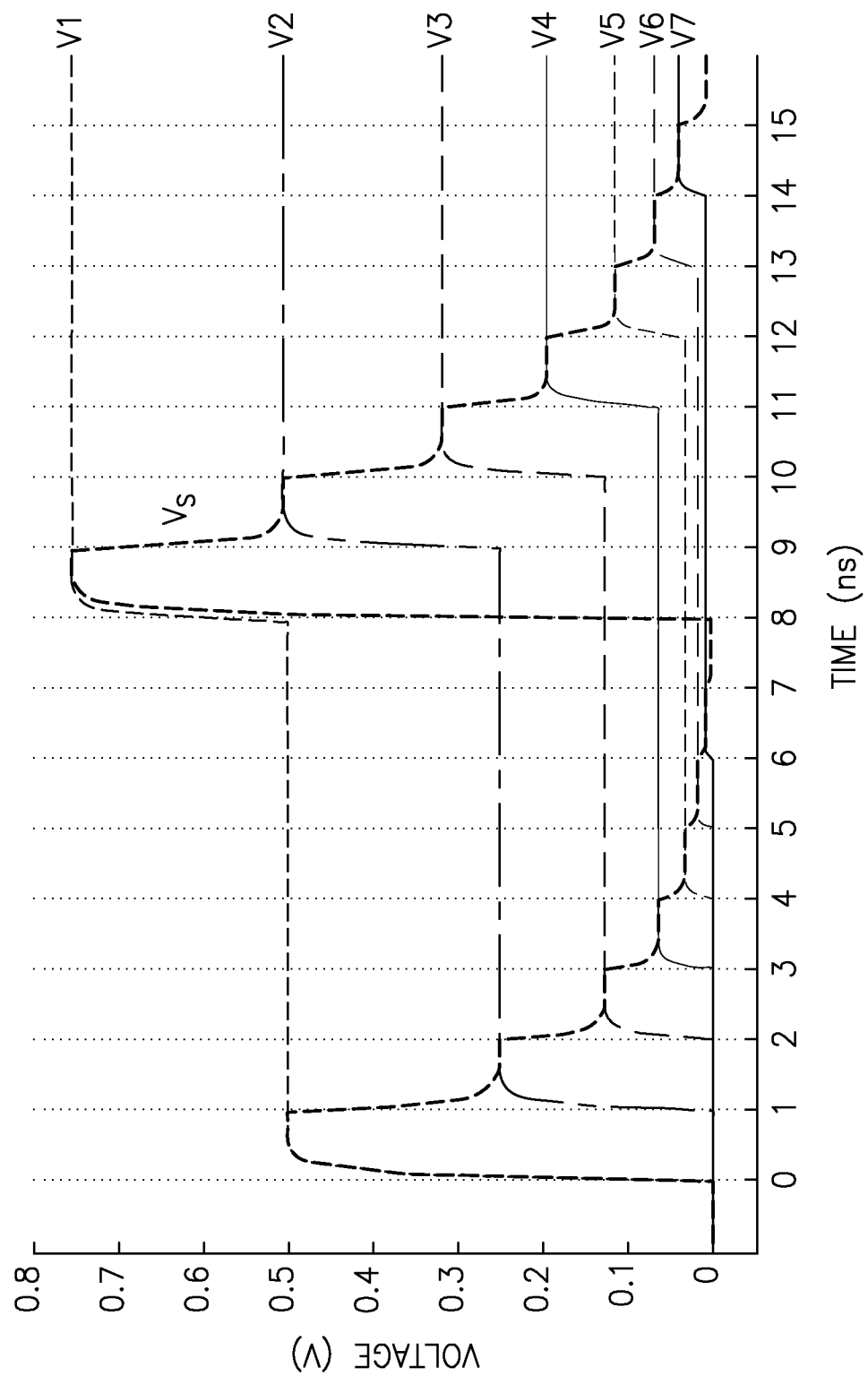
FIG. 19 is a diagram illustrating the step response of the charge rotating IIR7 filter in more detail.
Figure 20:
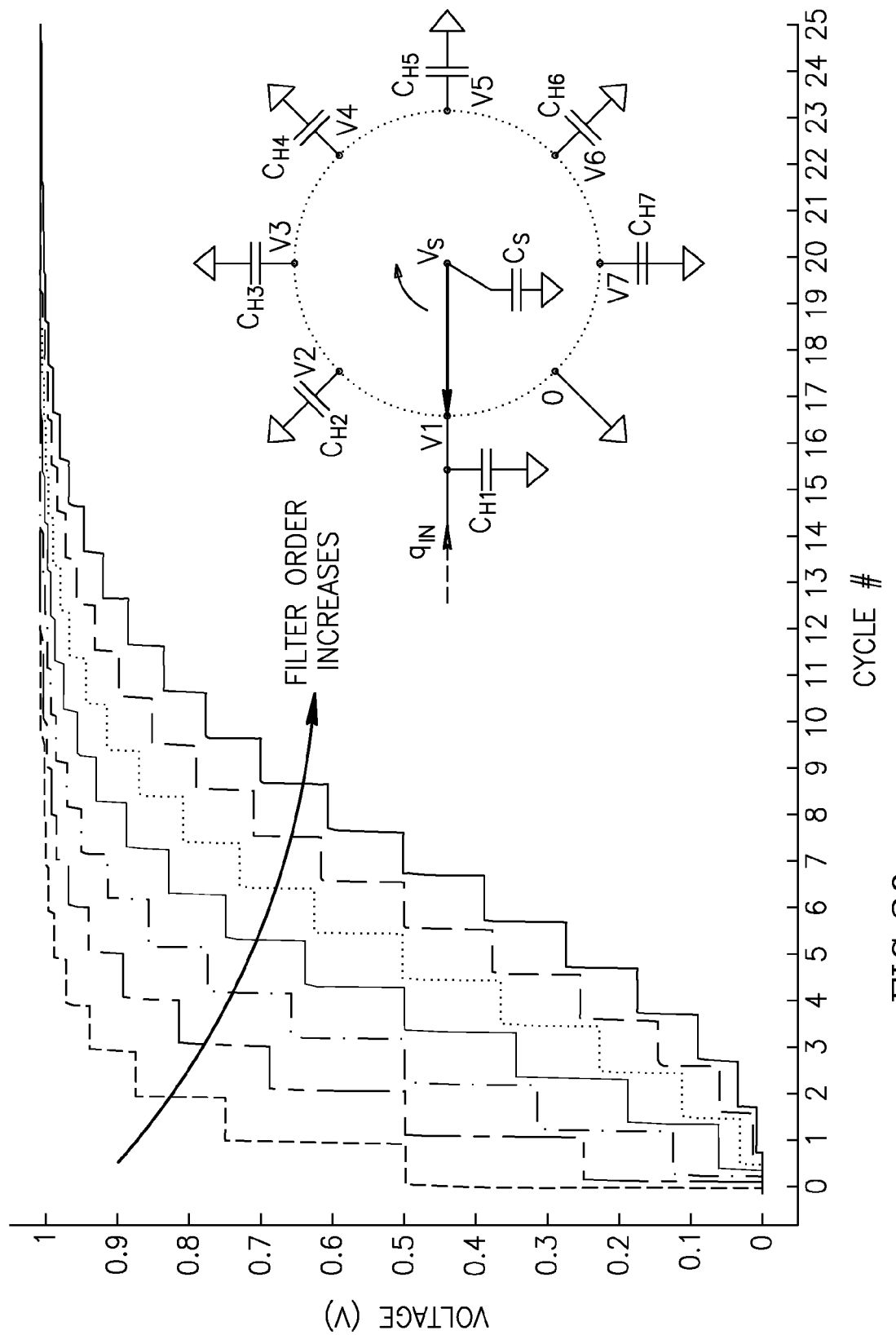
FIG. 20 is a diagram illustrating the whole step response of the charge rotating IIR7 filter.

To aid in understanding the operation of the charge rotating filter, its step response is plotted in FIGS. 19 and 20. At first, suppose that all the capacitors are empty of charge. For simplicity, we choose $C_S = C_H = 1$ pF. Also, we suppose that the input charge packet $q_{in}[n] = 1$ pC arrives every cycle at $\phi 1$. A zoom-in of the step response is plotted in FIG. 19. With reference also to FIG. 17A, at $\phi 1$, the input charge is transferred to both $C_{H1}$ and $C_S$ that sets the 0.5 V potential on both of them. $C_S$ that has sample of $1^{st}$-order filter is then connected to $C_{H2}$ at $\phi 2$. The result is 0.25V on both capacitors. Next at $\phi 3$, $C_S$ with the sample of $2^{nd}$-order filter is connected to $C_{H3}$ and the result is 0.125V. In this way, $C_S$ transfers charge from one history capacitor to the next until $C_{H7}$. Then, it gets reset at $\phi 8$. As shown in FIG. 19, outputs of stages with higher orders are growing more slowly. This is because their respective input sample has been accumulated several times before, meaning slower but longer and smoother integration. As plotted in FIG. 20, however, all of the outputs converge to 1V at steady-state.

To derive the DT transfer function (TF) of this filter, we need to first obtain its charge sharing equations. Considering that samples of the main output $V_{out} = V_7$ are ready at the end of $\phi 7$ we have $$\begin{cases} @\varphi 7: V_7[n] = \frac{C_{H7}}{C_{H7}+C_S} V_7[n-1] + \frac{C_S}{C_{H7}+C_S} V_6\left[n-\frac{1}{8}\right] \\ @\varphi 6: V_6\left[n-\frac{1}{8}\right] = \frac{C_{H6}}{C_{H6}+C_S} V_6\left[n-\frac{1}{8}-1\right] + \frac{C_S}{C_{H6}+C_S} V_5\left[n-\frac{2}{8}\right] \\ \vdots \\ @\varphi 2: V_2\left[n-\frac{5}{8}\right] = \frac{C_{H2}}{C_{H2}+C_S} V_2\left[n-\frac{5}{8}-1\right] + \frac{C_S}{C_{H2}+C_S} V_1\left[n-\frac{6}{8}\right] \\ @\varphi 1: V_1\left[n-\frac{6}{8}\right] = \frac{C_{H1}}{C_{H1}+C_S} V_1\left[n-\frac{6}{8}-1\right] + \frac{1}{C_{H1}+C_S} q_{in}\left[n-\frac{6}{8}\right] \end{cases} \quad (14)$$

In these equations, each $-\frac{1}{8}$ means one phase delay. At $\varphi 7$, $V_7$ is a function of its value at previous cycle ($-1$ delay) and a sample $V_6$ that comes from the previous phase ($-\frac{1}{8}$ delay). Likewise, charge sharing equations from $\phi 1$ to $\phi 6$ are derived. Converting all these equations into Z-domain, we can derive the following general equation for different outputs $$H_k(z) = \frac{V_k}{q_{in}} = \frac{1}{C_S} \cdot z^{-\frac{k-1}{8}} \cdot \prod_{i=1}^{k} \frac{1-\alpha_i}{1-\alpha_i z^{-1}}, \quad (15)$$

for $k = 1, 2, \ldots, 7$. In this equation, $\alpha_i = C_{H,i}/(C_{H,i}+C_S)$. Normally, we prefer to have all the poles identical and so we choose all the capacitors to have the same size $C_{H1-7} = C_H$. Then the transfer function of the main output (i.e. $V_7$) is simplified to the following $$H(z) = \frac{V_{out}}{q_{in}} = \frac{1}{C_S} \cdot z^{-\frac{6}{8}} \cdot \left(\frac{1-\alpha}{1-\alpha z^{-1}}\right)^7. \quad (16)$$

Inside the parenthesis is a $1^{st}$-order low-pass TF with unity gain. Also, $z^{-6/8}$ is a delay of 6 phases. Based on this equation, dc gain of $V_{out}$ to input charge, $q_{in}$, is $1/C_S$. Then, by using (6), the overall dc gain of this filter from input voltage to its output is $$A_V = \frac{V_{out}}{V_{in}} = g_m T_i \times \frac{1}{C_S} = g_m \times \frac{1}{C_S f_s}. \quad (17)$$

In this equation, $T_i = T_s$ is the time period of the cycle extending over the 8 phases. The second part of this equation $1/(C_S f_s)$ is an equivalent dc resistance of the sampling capacitor that is reset times per second. This filter has the same DC voltage gain as the IIR2 filter in (10).

For frequencies much lower than $f_s$, we can use bilinear transform to obtain the continuous-time transfer function of the filter $$\frac{V_k(s)}{V_{in}(s)} = A_V \times \frac{1}{\left(1 + \frac{1}{C_S f_s} \cdot C_H \cdot s\right)^k}. \quad (18)$$

This equation is similar to a transfer function of an RC LPF, i.e., $1/(1+RCs)$, with $-3$ dB bandwidth of $1/(RC)$. Poles of this equations are all located at $s = -C_S f_s / C_H$. It indicates that the bandwidth of the filter only depends on ratio of sampling and history capacitors and the sampling frequency. Since capacitor ratio has a very low variation, bandwidth of this filter is insensitive to PVT.

Figure 21:
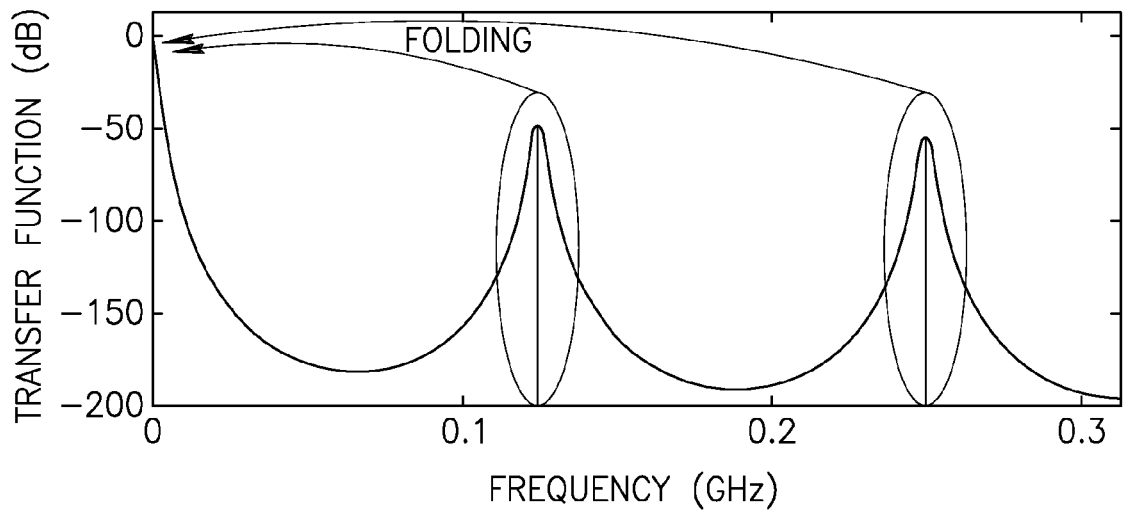
FIG. 21 is a diagram illustrating the wideband transfer function of the charge rotating IIR7 filter.
Figure 22:
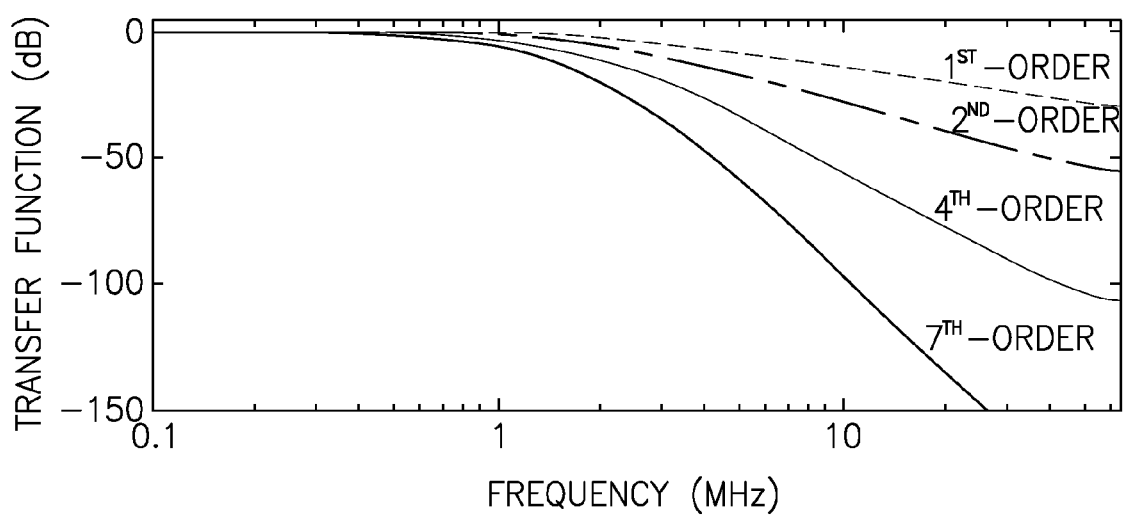
FIG. 22 is a diagram illustrating the Bode plot frequency response of the charge rotating IIR7 filter.

The wideband transfer function of this filter is plotted in FIG. 21. The antialiasing filter attenuates signals around $f_s$, $2f_s$, ... before the sampling folds them to dc. Also, the transfer functions of outputs with different orders are shown in FIG. 22. By going from $1^{st}$-order output to the $2^{nd}$-order output, the filtering slope increases from 20 dB/dec to 40 dB/dec. By going to $4^{th}$-order output, the slope increases to 80 dB/dec. Finally, roll-off of the $7^{th}$-order output transfer function of this filter reaches 140 dB/dec.

This filter has seven real poles but no complex conjugate poles. Therefore, transition between the flat pass-band frequency and the sharp filtering roll-off in FIG. 22 happens rather smoothly, whereas a sharp transition sometimes might be preferred. This sharp transition can be exploited in Butterworth and Chebyshev types of filters. The smooth transition band in the charge rotating IIR7 filter, however, appears acceptable for many applications. For example, a baseband channel-selection filter of an RF receiver is usually followed by an ADC. In that case, the smooth transition band can be fully compensated downstream in the digital domain processing by an equalizer.

Since the sampling capacitor $C_S$ rotates one turn per cycle, the sampling rate is the same as the cycling frequency. Also, the output rate of this filter is the same as the sampling rate, meaning no decimation occurs in the filter. Each cycle of this filter comprises eight phases, and, therefore, the sampling frequency $f_s$ is $f_{ref}/8$. For example, with a reference clock frequency of 1 GHz, the sampling rate is 125 MS/s. Considering the limited rejection of the antialiasing filter formed by the current integration, the filter aliases to dc some amount of signal at frequencies around $k \times f_s$ ($k=1, 2, 3 \ldots$), inside pass-band of the filter (see FIG. 21).

To avoid the aliasing, a higher sampling rate can be used. In addition, to have good stop-band rejection in discrete time filters the sampling rate is preferably several times higher than the desired bandwidth.

Operation of the charge rotating IIR7 filter such as shown in FIGS. 17A and 17B can be considered as eight different stages in series. As new data arrives at $\phi 1$ it is sequentially processed at each stage until $\phi 8$. Then the next data sample arrives. In this way, we have not used the full capacity (data rate) of each stage. For example, while the data is being processed at $\phi 7$ to evaluate the $7^{th}$-order output, other capacitors, $C_{H1}$ to $C_{H6}$, are unused awaiting a new sample. As we have history capacitors $C_{H1-7}$ holding the data between different stages, while having no data dependency of preceding stages on succeeding stages (i.e. no feedback) we are able to readily increase the data rate of this filter by incorporating a pipelining technique.

Figure 23A:
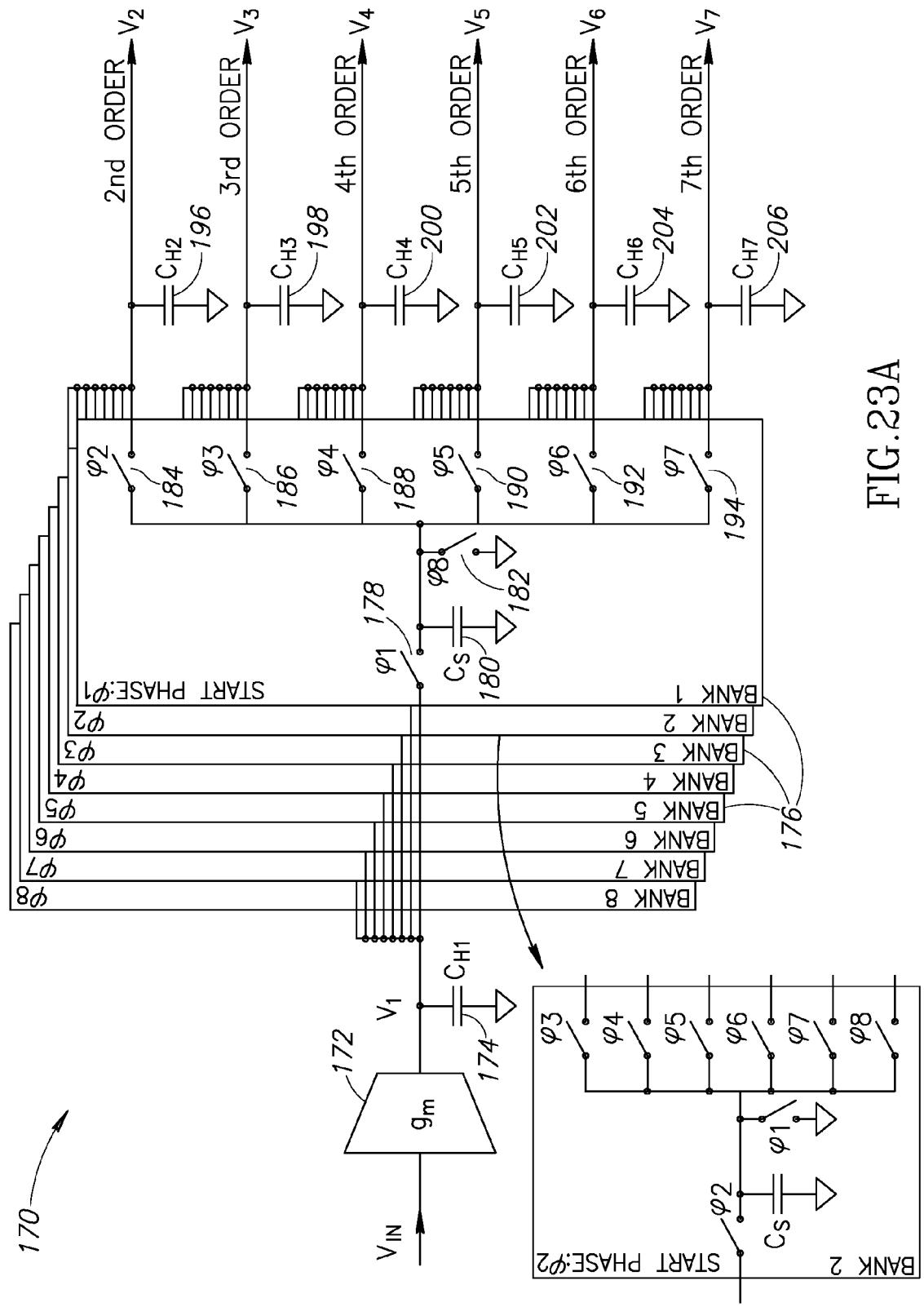
FIG. 23A is a diagram illustrating an example full rate charge rotating IIR7 filter using pipelining.
Figure 23B:
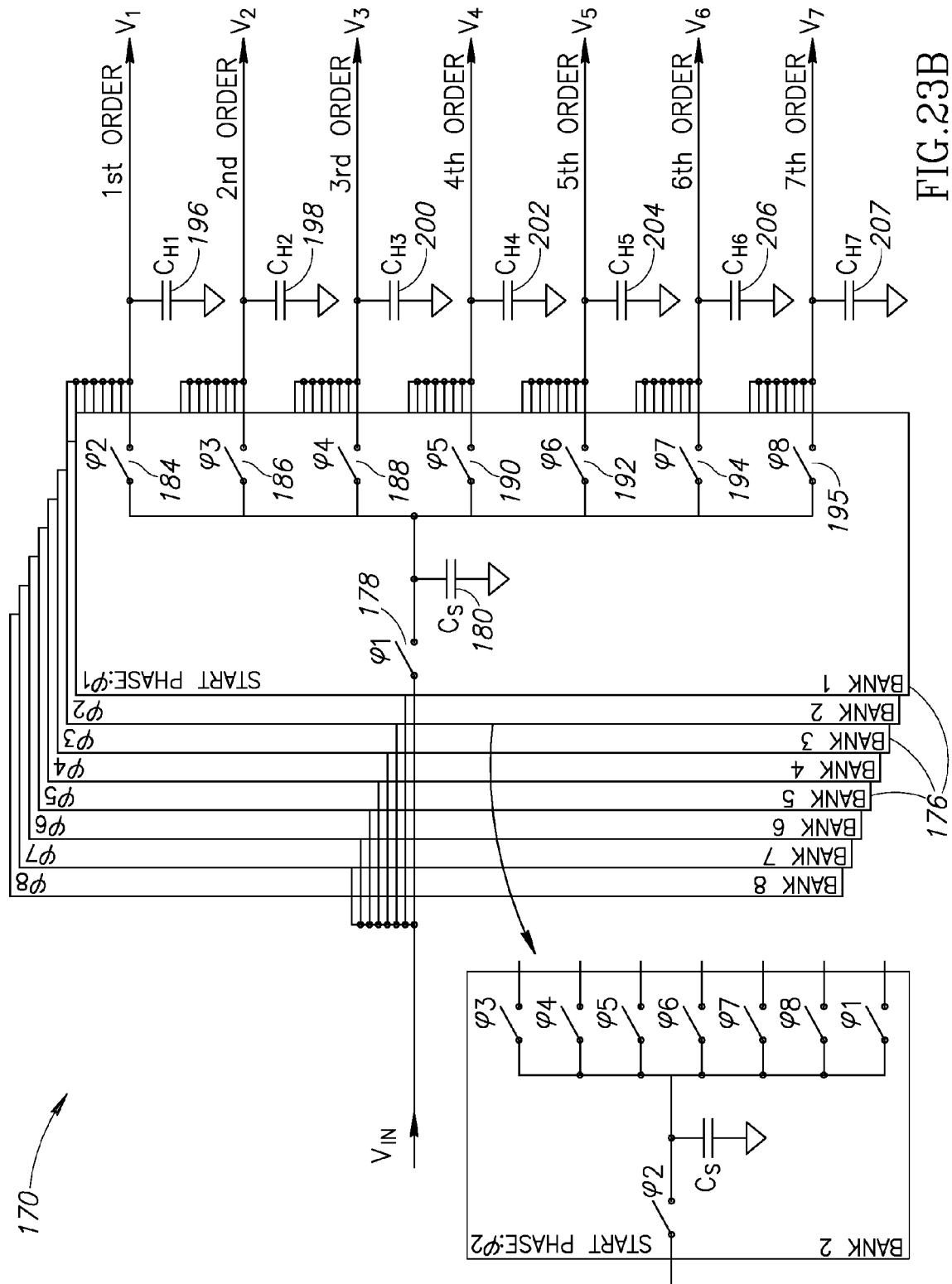
FIG. 23B is a diagram illustrating an example full rate charge rotating IIR7 low pass filter using pipelining in voltage sampling mode.

A schematic diagram illustrating an example full rate charge rotating IIR7 low pass filter using pipelining in charge sampling mode shown in FIG. 23A. A schematic diagram illustrating an example full rate charge rotating IIR7 low pass filter using pipelining in voltage sampling mode shown in FIG. 23B. The filter, generally referenced 170, comprises a plurality of switch banks 176 (eight in this example embodiment), gm-cell 172, history capacitors $C_{H1}$ 174, $C_{H2}$ 196, $C_{H3}$ 198, $C_{H4}$ 200, $C_{H5}$ 202, $C_{H6}$ 204, $C_{H7}$ 206, $C_{H8}$ 208. Each switch bank comprises a sampling capacitor $C_S$ 180 and switches 178, 182. Operation of the low pass filter of FIG. 23B is similar to that of the filter of FIG. 23A with the difference being the sampling mode (i.e. voltage sampling versus charge sampling) technique employed.

It is noted that the sampling capacitor $C_S$ 156 in FIGS. 17A and 17B is connected to only one of the eight nodes ($C_{H1-7}$ and GND) at each phase. Consider now that instead of only one $C_S$, we have eight sampling capacitors with each of them connected to one of the nodes. Then, by going to the next phase all of them are moving to the next node in the clockwise direction. At each new phase of this pipeline structure new data ($q_{in}[n]$) arrives and is then filtered on $C_{H1}$, a new data is transferred from $C_{H1}$ to $C_{H2}$ and filtered, from $C_{H2}$ to $C_{H3}$ and so on until $C_{H7}$, and a sampling capacitor is reset to ground. Therefore, considering the whole filter, there is no difference between the different phases. At each phase, a new data comes in and a new data comes out. For each sampling capacitor $C_S$ and its rotation network, a separate switch bank is used.

In this circuit, sampling frequency $f_s$ is the same as $f_{ref}$ which is eight times higher than previously. Charge sharing equations of this filter are as follows $$V_7[n] = \frac{C_{H7}}{C_{H7} + C_S} V_7[n-1] + \frac{C_S}{C_{H7} + C_S} V_6[n-1] \quad (19)$$

$$V_6[n] = \frac{C_{H6}}{C_{H6} + C_S} V_6[n-1] + \frac{C_S}{C_{H6} + C_S} V_5[n-1]$$

$$\vdots$$

$$V_2[n] = \frac{C_{H2}}{C_{H2} + C_S} V_2[n-1] + \frac{C_S}{C_{H2} + C_S} V_1[n-1]$$

$$V_1[n] = \frac{C_{H1}}{C_{H1} + C_S} V_1[n-1] + \frac{1}{C_{H1} + C_S} q_{in}[n]$$

Then, the transfer function of this filter is given by $$H_k(z) = \frac{V_k}{q_{in}} = \frac{1}{C_S} \cdot z^{-(k-1)} \cdot \prod_{i=1}^{k} \frac{1 - \alpha_i}{1 - \alpha_i z^{-1}} \quad (20)$$

for $k=1, 2, \ldots, 7$. This is the same as (16) except that the delay has been changed. Also, dc voltage gain of the full-rate IIR7 is the same as (17). Note that here $f_s$ is increased to $f_{ref}$.

In this filter, if there is some mismatch between $C_S$ and different $C_H$ capacitors it would slightly shift the pole locations. This small change might slightly change the filter bandwidth (e.g., less than a percent), which appears tolerable for most applications. If there is a mismatch, however, between the different $C_S$ capacitors in the full-rate structure, it affects the filter performance in a different way. As an example, suppose that only one of the eight sampling capacitors has a small mismatch with respect to the others. Then, each output of the filter experiences a slightly different charge sharing every eight clocks. This causes the input signal to alias to harmonics of $f_{ref}/8$ and also from these harmonics to around dc. Gain of this conversion is proportional to the relative mismatch (typically very small). On the other hand, bandwidth of the filter is normally less than $f_{ref}/8$. Hence, the aliased signal is filtered around the harmonics. In practice, this non-ideal effect is so small that it typically cannot be observed.

The output noise of the charge rotating $7^{th}$-order discrete time filter is made up of two main contributors: (1) noise from the input gm-cell and (2) noise from the passive switched-capacitor network.

Figure 24:
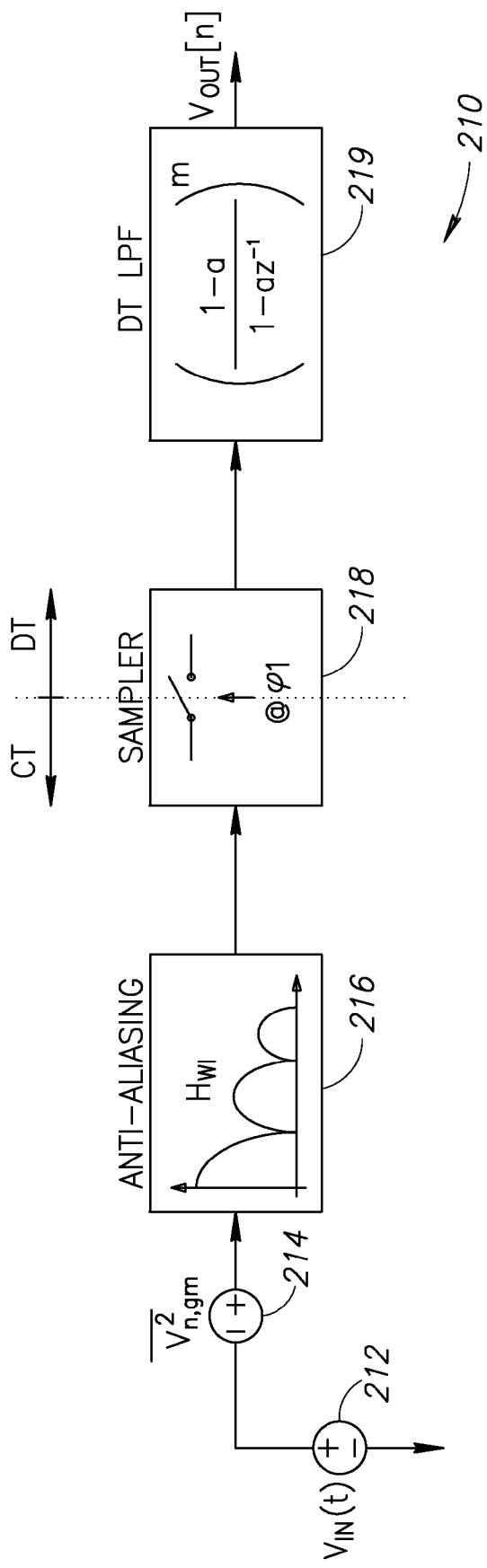
FIG. 24 is a high level block diagram illustrating an example model of the charge rotating IIR7 filter for $m^{th}$-order output.
Figure 25A:
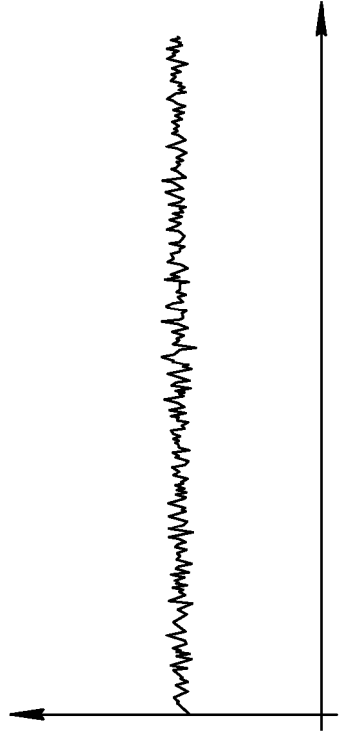
FIG. 25A is a diagram illustrating the input-referred noise of the $g_m$-cell.
Figure 25B:
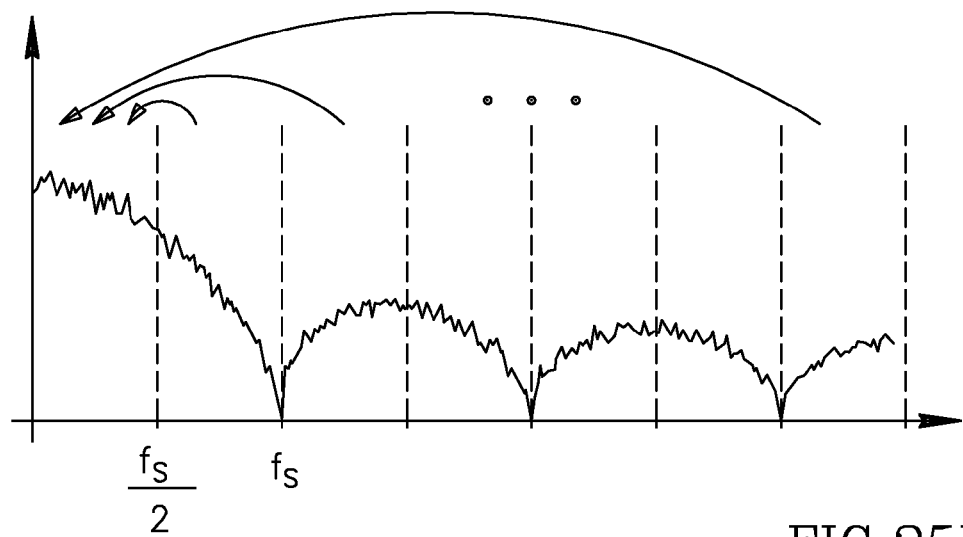
FIG. 25B is a diagram illustrating the noise shaped by the antialiasing filter.
Figure 25C:
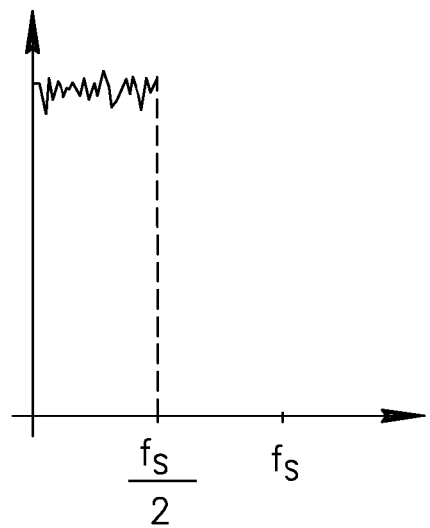
FIG. 25C is a diagram illustrating the sampled noise fed into the discrete time filter.

FIG. 24 illustrates a top-level signal flow diagram of the high-order IIR filter, generally referenced 210. At first, assume that $V_{in}$ 212 is zero for this noise analysis. $\overline{V_{n,gm}^2}$ 214 is a power of an input-referred noise of the gm-cell (see FIG. 25A). Integration of the gm-cell output current on the sampling capacitor forms the antialiasing filter 218 with a transfer function of $H_{W1}$, as described in (6). Therefore, output noise of the gm-cell is shaped by $H_{W1}$ before sampling 218, as shown in FIG. 25B. The sampling process folds frequencies in the range of $f_s/2$-to-$f_s$, $f_s$-to-$3f_s/2$ and so on, to the fundamental 0-to-$f_s/2$ range. Since the noise in various bands is uncorrelated, their power is summed. It can be shown that the output is a flat noise for a white input noise, as shown in FIG. 25C. Power spectral density (PSD) of the sampled noise charge ($q_{in}$) can be found by equating power of the sampled noise with power of the shaped noise before sampling $$\int_0^{f_s/2} \overline{Q_{n,in}^2} df = \int_0^\infty \overline{V_{n,gm}^2} \times |H_{W1}(f)|^2 df \quad (21)$$

By substituting (6) into the above equation and then simplifying it, we obtain $$\frac{f_s}{2}\overline{Q_{n,in}^2} = \frac{T_i \cdot g_m^2}{2} \overline{V_{n,gm}^2} \quad (22)$$

Since in our case $T_i=1/f_s$, noise PSD of the sampled input charge will be $$\overline{Q_{n,in}^2} = \frac{g_m^2}{f_s^2} \overline{V_{n,gm}^2} \quad (23)$$

The above noise is feed to the switched-capacitor filter and is shaped by its transfer function $$\overline{V_{n,out}^2} = |H(z)|^2 \times \overline{Q_{n,in}^2} \quad (24)$$

For example, output voltage noise PSD of the CR IIR7 can be calculated by substituting (16) and $$z = e^{j\Omega} = e^{j\omega T_s} = e^{j2\pi f/f_s} \quad (25)$$

into (24) yields $$\overline{V_{n,out}^2} = \left| \frac{1}{C_S} \cdot e^{-j6\Omega} \cdot \left( \frac{1-\alpha}{1-\alpha e^{-j\Omega}} \right)^7 \right|^2 \times \frac{g_m^2}{f_s^2} \overline{V_{n,gm}^2} \quad (26)$$

$$= \left( \frac{1-2\alpha+\alpha^2}{1-2\alpha\cos\Omega+\alpha^2} \right)^7 \times \left( \frac{g_m}{C_S f_s} \right)^2 \overline{V_{n,gm}^2}$$

In the above equation, $g_m/(C_S f_s)$ is the voltage gain of the filter calculated also in (7).

Figure 26:
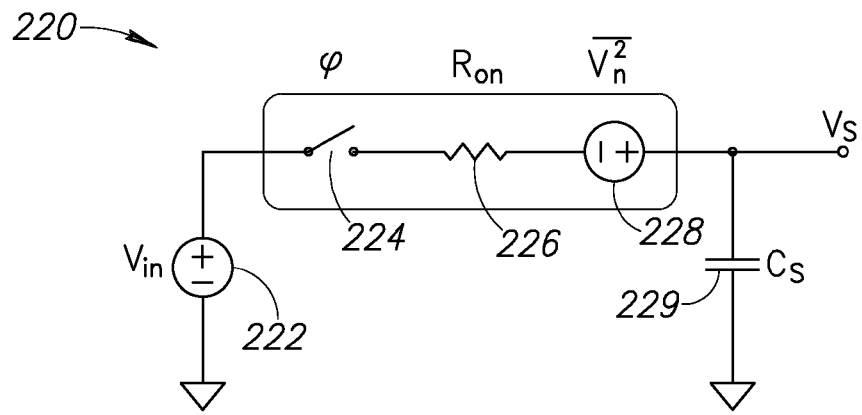
FIG. 26 is a schematic diagram illustrating an example noise model of a voltage sampling process.
Figure 27A:
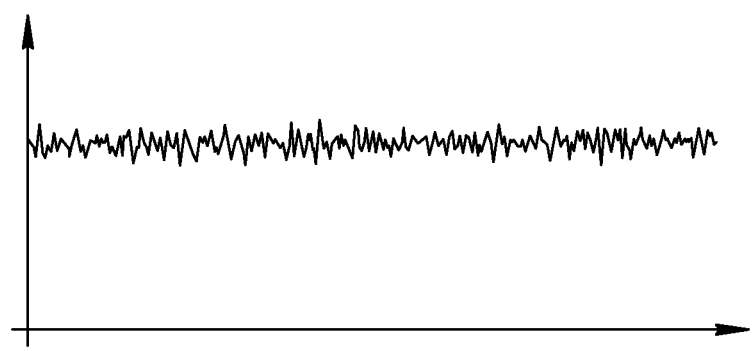
FIG. 27A is a diagram illustrating the switch resistance noise.
Figure 27B:
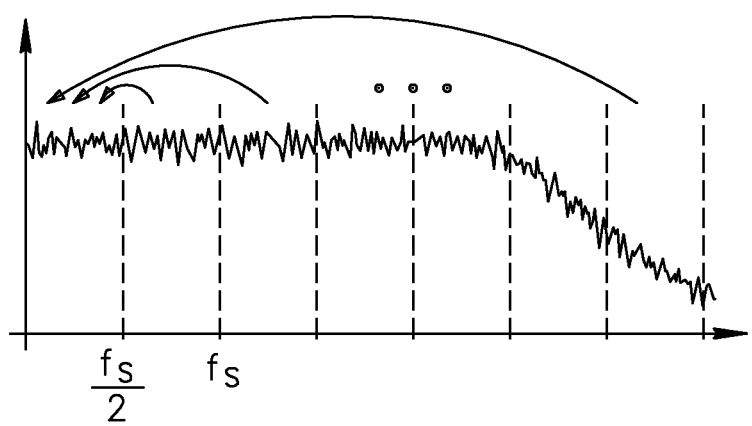
FIG. 27B is a diagram illustrating the noise shaped by the RC filter.
Figure 27C:
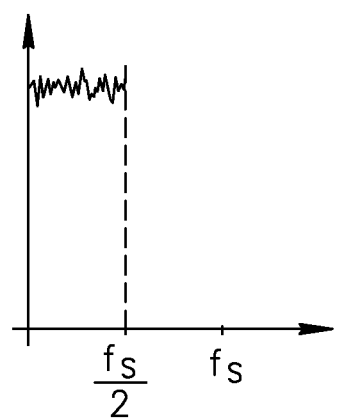
FIG. 27C is a diagram illustrating the sample noise.

The second key noise contributor of the filter is from the switched-capacitor network. Before calculating this noise we first discuss noise of a voltage sampling process. In FIG. 26, a voltage sampler that includes noise of its switch 224 is illustrated. In this circuit, assume that $V_{in}$ 222 is zero and we are interested to find the discrete-time output noise caused by the sampling process. When the switch 224 is on, it has a limited low resistance ($R_{on}$). A series voltage source 228 models the resistor's thermal noise with a constant PSD, as shown in FIG. 27A $$S_R(f) = 4kTR_{on}, f \approx 0 \quad (27)$$

where k is Boltzmann's constant and T is the absolute temperature. When the switch is on, noise of the resistor 226 is shaped by the RC filter with a time constant of $\tau = R_{on}C_S$ and then appears at the output. At the moment the switch is disconnected, the output noise is sampled and held on $C_S$ 229. The sampling causes noise folding from frequency ranges of $f_s/2$-to-$f_s$, $f_s$-to-$3f_s/2$ and so on, to the 0-to-$f_s/2$ range and summed, as shown in FIG. 27B. If the time constant $\tau$ is much lower than the "on" duration of the switch, it can be shown that the summation of all folded noise sources will be flat (i.e. white noise). As shown in FIG. 27C, single-side noise spectral density of the sampled noise at the output can be expressed as $$\overline{V_S^2}(f) = \frac{kT}{C_S \cdot f_s/2}, \quad (28)$$

$$0 \le f \le f_s/2.$$

If we integrate this noise over the entire frequency range, its power is $kT/C_S$.

To simplify the problem for more complicated switched-capacitor circuits, we can use the following assumption: the continuous-time noise source $\overline{V_n^2}$ with PSD of (27), can be considered as a discrete-time noise source with PDS described in (28). In this way it is not necessary to consider the effect of the RC filter in switched-capacitor noise analysis.

Figure 28:
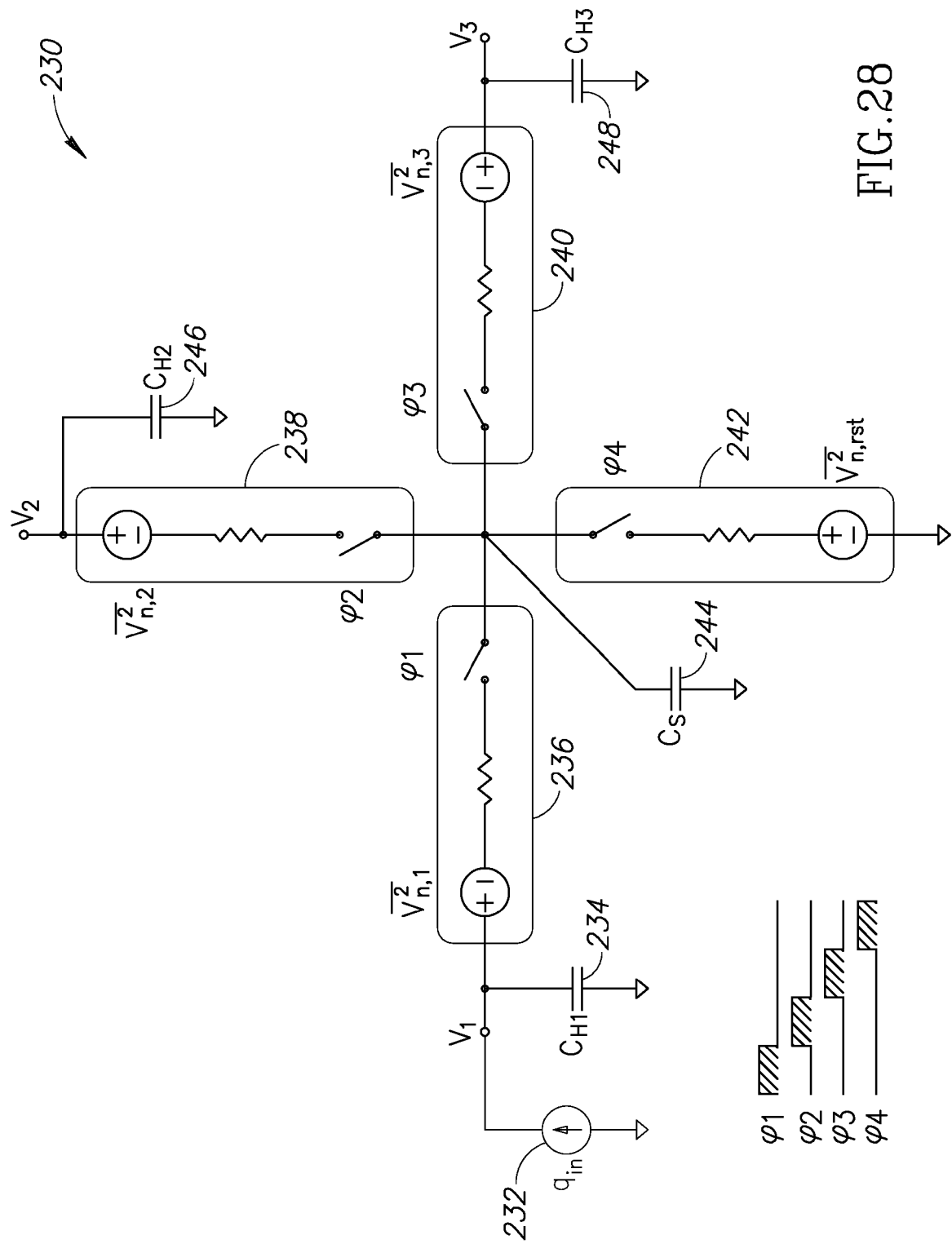
FIG. 28 is a schematic diagram illustrating an example noise model of a charge rotating $3^{rd}$ order filter.

To calculate the output noise of the charge rotating IIR7, we begin with a lower order for simplicity and then extend it to the seventh order. FIG. 28 illustrates a charge rotating 3rd-order filter, generally referenced 230. The sampling capacitor 244 is reset at $\phi 4$, and then is connected to $C_{H1}$ 234, $C_{H2}$ 246 and $C_{H3}$ 248 at $\phi 1$, $\phi 2$ and $\phi 3$, respectively. In this filter, the input current signal is considered zero. Hence, we can remove it from the circuit for noise analysis. The aim of the following calculation is to find the DT output noise at different outputs, i.e. $V_1$, $V_2$ and $V_3$, generated by noise sources $\overline{V_{n,rst}^2}$ 242, $\overline{V_{n,1}^2}$ 236, $\overline{V_{n,2}^2}$ 238 and $\overline{V_{n,3}^2}$ 240. To simply equations, for the remainder of the calculation we define $$\alpha_{1-3} = \frac{C_{H1-3}}{C_{H1-3} + C_S}. \quad (29)$$

As defined in (28) the PSD of $\overline{V_{n,rst}^2}$ is $$\overline{V_{n,rst}^2} = \frac{kT}{C_S \cdot f_s/2} \tag{30}$$

However, other noise sources are differently calculated. Since from φ1 to φ3, $C_S$ is in series with $C_{H1}$ to $C_{H3}$, the total capacitance at each phase should be taken into account for noise PSD $$\overline{V_{n,1-3}^2} = \frac{kT}{\frac{C_{H1-3} C_S}{C_{H1-3} + C_S} \cdot f_s/2} \tag{31}$$

$$= \frac{kT}{\alpha_{1-3} C_S \cdot f_s/2}$$

$$= \frac{\overline{V_{n,rst}^2}}{\alpha_{1-3}}.$$

Sampling frequency, $f_s$, in the above two equations is the repetition frequency of each phase, equal to $f_{ref}/4$ in this case.

At φ4, $C_S$ is reset. In other words, the effects of noise sources at other phases on $C_S$ are all cleared. At the end of this phase, when $C_S$ is disconnected from ground, it samples noise of the reset switch $\overline{V_{n,rst}^2}$ $$@φ4: v_s[n] = v_{n,rst}[n] \tag{32}$$

Then, $C_S$ is connected to $C_{H1}$ at φ1. The charge sharing equations at this phase are $$@φ1: v_1[n] = \frac{C_{H1}}{C_{H1}+C_S} v_1[n-1] + \frac{C_S}{C_{H1}+C_S} v_{n,1}[n] + \frac{C_S}{C_{H1}+C_S} v_S\left[n-\frac{1}{4}\right] \tag{33}$$

where $v_1[n-1]$ is the previous history of $C_{H1}$, $v_s[n-¼]$ is a voltage sample of $V_S$ from the previous phase (i.e. φ4), and $v_{n,1}[n]$ is noise of switch at φ1. Combining the above two equations and (29) we obtain $$@φ1: v_1[n] = \alpha_1 v_1[n-1] + (1-\alpha_1) v_{n,rst}\left[n-\frac{1}{4}\right] + (1-\alpha_1) v_{n,1}[n]. \tag{34}$$

Now, we can calculate noise transfer functions to the output $V_1$ by using z-transform $$V_1 = \frac{1-\alpha_1}{1-\alpha_1 z^{-1}} V_{n,1} + \frac{(1-\alpha_1)z^{-\frac{1}{4}}}{1-\alpha_1 z^{-1}} V_{n,rst} \tag{35}$$

To see PSD of $V_1$, we substitute $z = e^{j\Omega}$ and it follows that $$\overline{V_1^2}(e^{j\Omega}) = \left|\frac{1-\alpha_1}{1-\alpha_1 e^{-j\Omega}}\right|^2 \overline{V_{n,1}^2} + \left|\frac{(1-\alpha_1)e^{-\frac{1}{4}j\Omega}}{1-\alpha_1 e^{-j\Omega}}\right|^2 \overline{V_{n,rst}^2} \tag{36}$$

Then, it reduces to $$\overline{V_1^2}(e^{j\Omega}) = \frac{1-2\alpha_1+\alpha_1^2}{1-2\alpha_1 \cos\Omega+\alpha_1^2} \times (\overline{V_{n,1}^2} + \overline{V_{n,rst}^2}). \tag{37}$$

Before going to the next phase, we need to calculate the remaining noise on $C_S$ at the time it is disconnected from $C_{H1}$ $$@φ1: v_s[n] = v_1[n] - v_{n,1}[n] \tag{38}$$

Using (35), noise transfer function on $V_S$ at the end of φ1 is $$@φ1: V_S = -\frac{\alpha_1(1-z^{-1})}{1-\alpha_1 z^{-1}} V_{n,1} + \frac{(1-\alpha_1)z^{-\frac{1}{4}}}{1-\alpha_1 z^{-1}} V_{n,rst} \tag{39}$$

Then, its noise PSD is simplified to $$\overline{V_S^2}(e^{j\Omega}) = \left|\frac{\alpha_1(1-e^{-j\Omega})}{1-\alpha_1 e^{-j\Omega}}\right|^2 \overline{V_1^2} + \left|\frac{(1-\alpha_1)e^{-\frac{1}{4}j\Omega}}{1-\alpha_1 e^{-j\Omega}}\right|^2 \overline{V_{n,rst}^2} \tag{40}$$

$$= \frac{\alpha_1(2-2\cos\Omega)}{1-2\alpha_1 \cos\Omega+\alpha_1^2} \overline{V_{n,1}^2} + \frac{1-2\alpha_1+\alpha_1^2}{1-2\alpha_1\cos\Omega+\alpha_1^2} \overline{V_{n,rst}^2}$$

Substituting (31) in this equation, it reduces to $$\overline{V_S^2}(e^{j\Omega}) = \tag{41}$$

$$\left(\frac{\alpha_1(2-2\cos\Omega)}{1-2\alpha_1\cos\Omega+\alpha_1^2} \times \frac{1}{\alpha_1} + \frac{1-2\alpha_1+\alpha_1^2}{1-2\alpha_1\cos\Omega+\alpha_1^2}\right) \times \overline{V_{n,rst}^2} = 1 \times \overline{V_{n,rst}^2}.$$

This appears to be a very interesting and important result. It suggests that the noise PSD of $V_S$ at φ1 (i.e. at the beginning of the input sample processing cycle) is exactly the same as its PSD at φ4, which is several clock cycles later at the end of the input sample processing cycle. This can be explained as follows: at the end of φ4, $V_S$ has a PSD of $\overline{V_{n,rst}^2}$, which is a flat noise. Next, when $C_S$ is connected to $C_{H1}$ at φ1, this noise is low-pass filtered (the second part of (40)). At this phase, however, a high-pass filtered noise originated from $\overline{V_{n,1}^2}$ is added to $V_S$ (the first part of (40)). These two noise contributions are shown in FIG. 29A. The latter noise compensates for the attenuated part of the former noise in a way that the total PSD remains constant and equal to the original one, $\overline{V_{n,rst}^2}$. This result is independent of history capacitor values.

Similar to what was described for φ1, the same set of equations, (33) through (41), are valid for other phases executing before the reset phase (φ4 in this case). Therefore, in general we have $$\overline{V_i^2}(e^{j\Omega}) = \frac{1-2\alpha_i+\alpha_i^2}{1-2\alpha_i\cos\Omega+\alpha_i^2} \times (\overline{V_{n,i}^2} + \overline{V_{n,rst}^2}) \tag{42}$$

or i=1, 2, 3 in the CR $3^{rd}$-order filter. Also, $V_S$ at the end of each phase has the same noise PSD as calculated in (41)

Although it would seem at first that that noise of higher order outputs should be increased due to the accumulation of the noise coming from different noise sources, surprisingly, (42) rejects this hypothesis. Suppose that all the history capacitors have equal capacitance, such that the noise PSD of all different outputs is the same. In other words, it does not build up by going to higher orders. The main reason comes from (41). Noise PSD of $V_S$ at each phase is the same as the previous phase and equal to $\overline{V_{n,rst}^2}$.

Figure 29B:
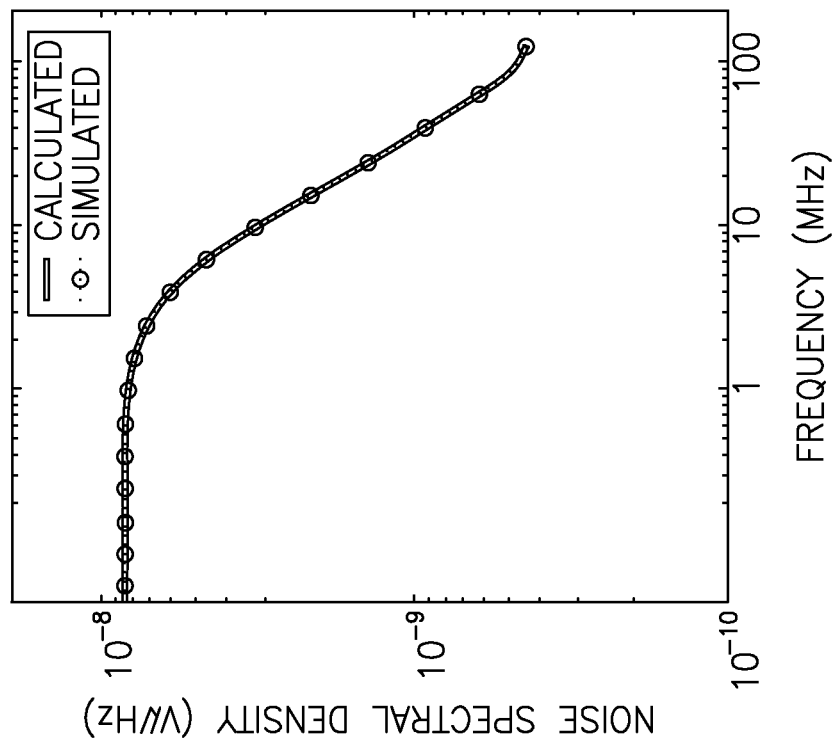
FIG. 29B is a diagram illustrating the noise spectral density of $V_1$ at the end of φ1.
Figure 29A:
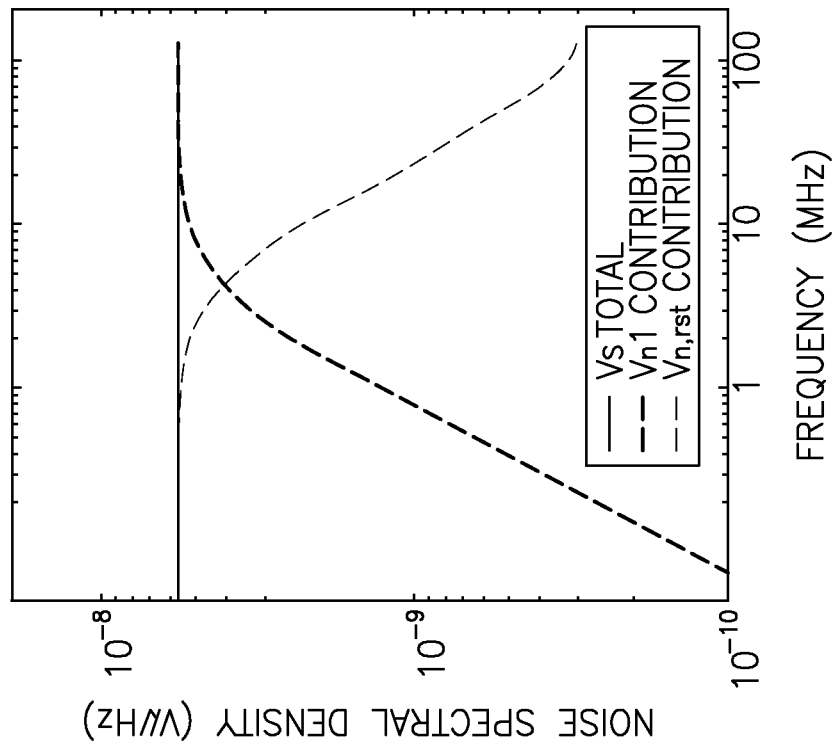
FIG. 29A is a diagram illustrating the noise spectral density of $V_S$ at the end of φ1.

A diagram illustrating the noise spectral density of $V_1$ at the end of φ1 shown in FIG. 29B. The graph plots noise spectral density of different outputs with equal $C_H$. To validate the above equations, noise of the switched-capacitor circuit has been simulated utilizing a circuit simulator such as Cadence SpectreRF PNOISE. Simulation results match very closely with (42). Another interesting point regarding the noise of each output is about its total noise power $$P_{n,i} = \int_0^{f_s/2} \overline{V_i^2}(e^{j2\pi f/f_s}) df \qquad (43)$$

$$= \int_0^{f_s/2} \frac{1 - 2\alpha_i + \alpha_i^2}{1 - 2\alpha_i \cos(2\pi f/f_s) + \alpha_i^2} (\overline{V_{n,i}^2} + \overline{V_{n,rst}^2}) df$$

$$= \frac{f_s}{2} \times \frac{1-\alpha_i}{1+\alpha_i} \times (\overline{V_{n,i}^2} + \overline{V_{n,rst}^2})$$

Using (31) it reduces to $$P_{n,i} = \frac{f_s}{2} \times \frac{1-\alpha_i}{1+\alpha_i} \times \left(\frac{1}{\alpha_i} + 1\right) \times \frac{kT}{C_S \cdot f_s/2} \qquad (44)$$

$$= \frac{kT}{C_{H,i}}$$

This equation states that the total noise power of each output only depends on $C_H$ of that output and the absolute temperature. This result is same as the well-known output noise power of an RC filter that is kT/C.

All the above results and equations are valid and extendable to higher order filters, e.g., the charge rotating IIR7 discussed supra. Note that if a pipelining technique is used to increase the sampling rate of the filter, all the above equations remain the same except that the new sampling frequency should be used.

Thus, the noise of the gm-cell is shaped by the filter transfer function and then appears at the output. The higher the filtering order, the more reduction of out-of-band noise caused by the gm-cell. Also, the noise of the switched-capacitor circuit is the same at different outputs. Hence, by increasing the filtering order, the overall noise level remains the same. As a whole, the total output noise decreases slightly by raising the order of the charge rotating filter. This salient advantage is in contrast with conventional filters. For example, in an active-RC filter, additional resistors and op amps are required to increase an order thus leading to higher output noise.

In one embodiment, the high-order charge-rotating (CR) DT filter comprises a gm-cell, switches, capacitors and a waveform (i.e. multiple clocks) generator circuit. Therefore, it is compatible with digital nanoscale CMOS technology. Implementing the filter in a finer process reduces the area of the capacitors, switches and the waveform generator while maintaining the same performance. In fact, the filter circuit scales down with Moore's law. In addition, by switching from one process node to the next, its performance improves where we have faster switches, capacitors with higher density, higher $g_m$ values and a faster or lower power waveform generator digital circuit. Hence, this architecture is amenable to deep nanoscale CMOS technology. Bandwidth of the filter is accurate and, as described in (18), is set by the capacitor ratio and clock frequency. In CMOS processes, the capacitor ratio has the lowest PVT variation if the same type of capacitors is used. A key feature of this filter eliminates any need for calibration which is necessary for many prior art filter types. Due to the fast switches with low "on" resistance coupled with use of pipelining, the filter of the present invention has an ultra-high sampling rate (in range of GS/s). Hence, unwanted aliasing is avoided or minimized. The DT high-order filter also exhibits ultra-low noise. This is due to an absolute minimum number of noisy components (i.e. the gm-cell and switched-capacitor network). Also as described supra, the noise of the switched-capacitor network does not accumulate at higher orders. The use of a single lossy component to realize seven poles substantially reduces the noise of the switched-capacitor circuit compared to seven cascaded RC filters. Since the switched-capacitor portion of this filter is extremely linear, the filter achieves good linearity with careful design of the gm-cell.

In one embodiment, the CR filter is implemented differentially. For illustration purposes only, the filter, generally referenced 250, is shown single-ended in FIG. 30. Differential implementation permits having a larger swing and also reduces the clock feedthrough substantially.

The filter operates in either of two modes: (1) charge sampling and (2) voltage sampling. In the charge-sampling mode, as described supra, the gm-cell converts the input voltage into current and then the resulting charge (i.e. the integrated current) is sampled. Although there is an active gm-cell in this mode, the filtering network is fully passive. This means that during different phases, charge is not injected into the switched-capacitor network other than the input charge packet. Hence, the filter is semi-passive in this mode.

In the voltage-sampling mode, the gm-cell is bypassed and disconnected from the power supply. In addition, $C_{H1}$ is eliminated so as not to load the input. This is achieved by means of a "mode control" input in FIG. 30 that controls switches 254 and 258. In this way, the input voltage (instead of the input charge) is directly sampled by the $C_S$ capacitors 266. In the voltage sampling-mode, the filter is fully passive without any active component. In this mode, the removal of the first history capacitor 260 lowers the filtering order to $6^{th}$ order instead of the $7^{th}$ order in the charge-sampling mode. Note that in an alternative embodiment, the $7^{th}$-order of the filter in voltage sampling mode can be maintained by replacing GND with a history capacitor at φ8.

Figure 31:
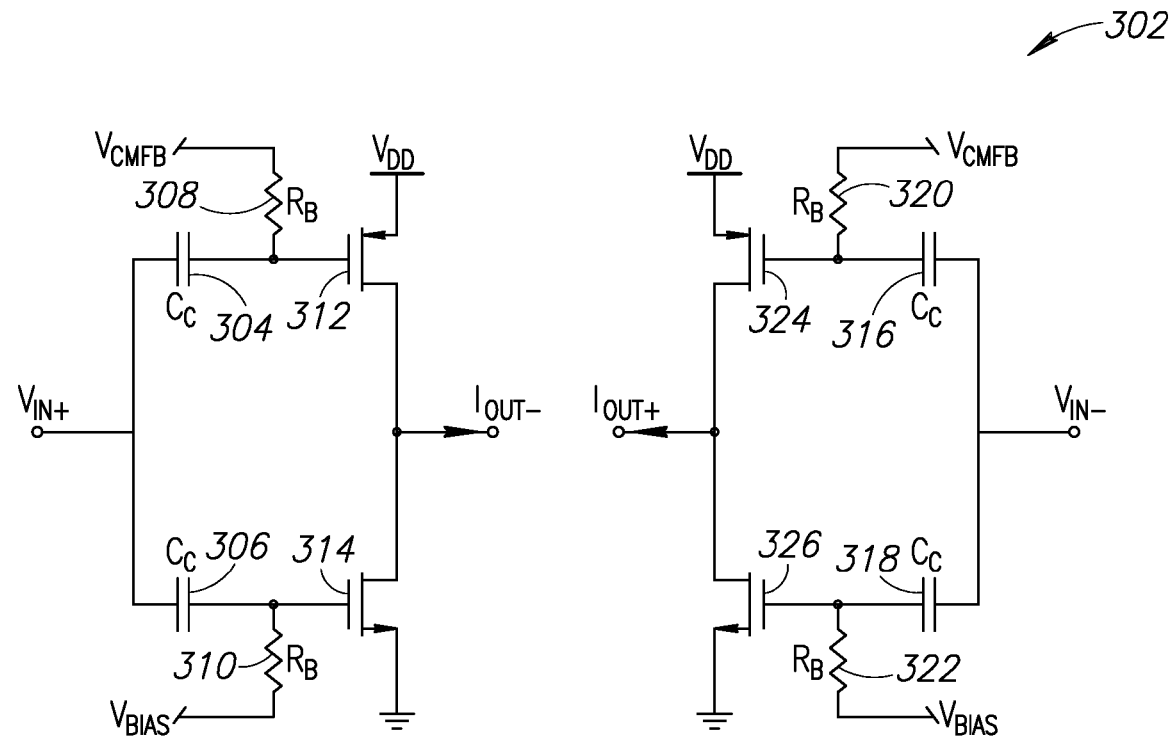
FIG. 31 is a schematic diagram illustrating an inverter based pseudo-differential $g_m$-cell.

Since a key feature of the filter of the present invention is the amenability to process scaling, a simple inverter-based gm-cell is used which is shown in more detail in FIG. 31. In this pseudo-differential gm-cell, generally referenced 302, a bias voltage $V_{bias}$ comes from a diode-connected NMOS and mirrors a bias current into the gm-cell. Also, a common-mode feedback circuit sets common-mode output voltage to $V_{DD}/2$ by adjusting $V_{CMFB}$. The simplicity of this gm-cell allows us to scale it smaller using finer processes.

Coupling capacitors $C_C$ 306, 304, 316, 318 and bias resistors $R_B$ 308, 310, 320, 322 of this gm-cell set a lower limit of frequency response. In most cellular applications, a low limit frequency exists such that information whose spectrum is lower than this is not important. In this embodiment, $C_C$ and $R_B$ are chosen to be as large as possible. They set a low limit frequency of a few kHz for the filter. If such a limit is not acceptable for the particular application, then other gm-cell architectures well-known in the art can be used. Alternatively, the filter in the voltage-sampling mode can be used as it passes frequencies down to dc. As the limited output resistance of this gm-cell may affect the filtering operation of the switched-capacitor network, we have tried to increase it to several times higher than the equivalent dc resistance of the SC circuit.

Despite using a simple inverter-based gm-cell, the gm-cell provides good linearity. By adjusting NMOS and PMOS transistor sizes as well as bias current and providing a low enough resistance (by the SC circuit) at its output, a high IIP3 is obtained.

Regarding the Cc capacitors of this filter, MOS capacitors with high density are preferably used. It is not possible, however, to use them differentially. Using a differential capacitor has the advantage of reducing the required capacitance and area by four times compared to using two single-ended capacitors. Hence, in one embodiment standard MoM (metal-oxide-metal) capacitors are used that can be implemented differentially. The history capacitors $C_{H1-7}$ range from 0.5-to-128 pF digitally selectable using eight bits. To converse area, they have been implemented differentially. For the filter sampling capacitors, MoM capacitors are used such that they can be well matched with the history capacitors. This reduces variations due to PVT as compared to the case of using two different types of capacitors. The sampling capacitors $C_S$ range from 0.75-to-4.5 pF digitally selectable using four bits. Here, instead of implementing $C_S$ differentially, they are implemented single-ended. We can then set the common-mode voltage of the filter by terminating $C_S$ to $V_{CM}$ instead of ground. This voltage matches the output common-mode voltage of the gm-cell and is chosen to be $V_{DD}/2$. To adjust the bandwidth of the filter, we $C_S$ is fixed and $C_H$ changed. In this manner, gain and linearity of the circuit does not change. Also, if the sampling frequency is changed, we change $C_S$ inversely to maintain the same bandwidth and gain.

Figure 30:
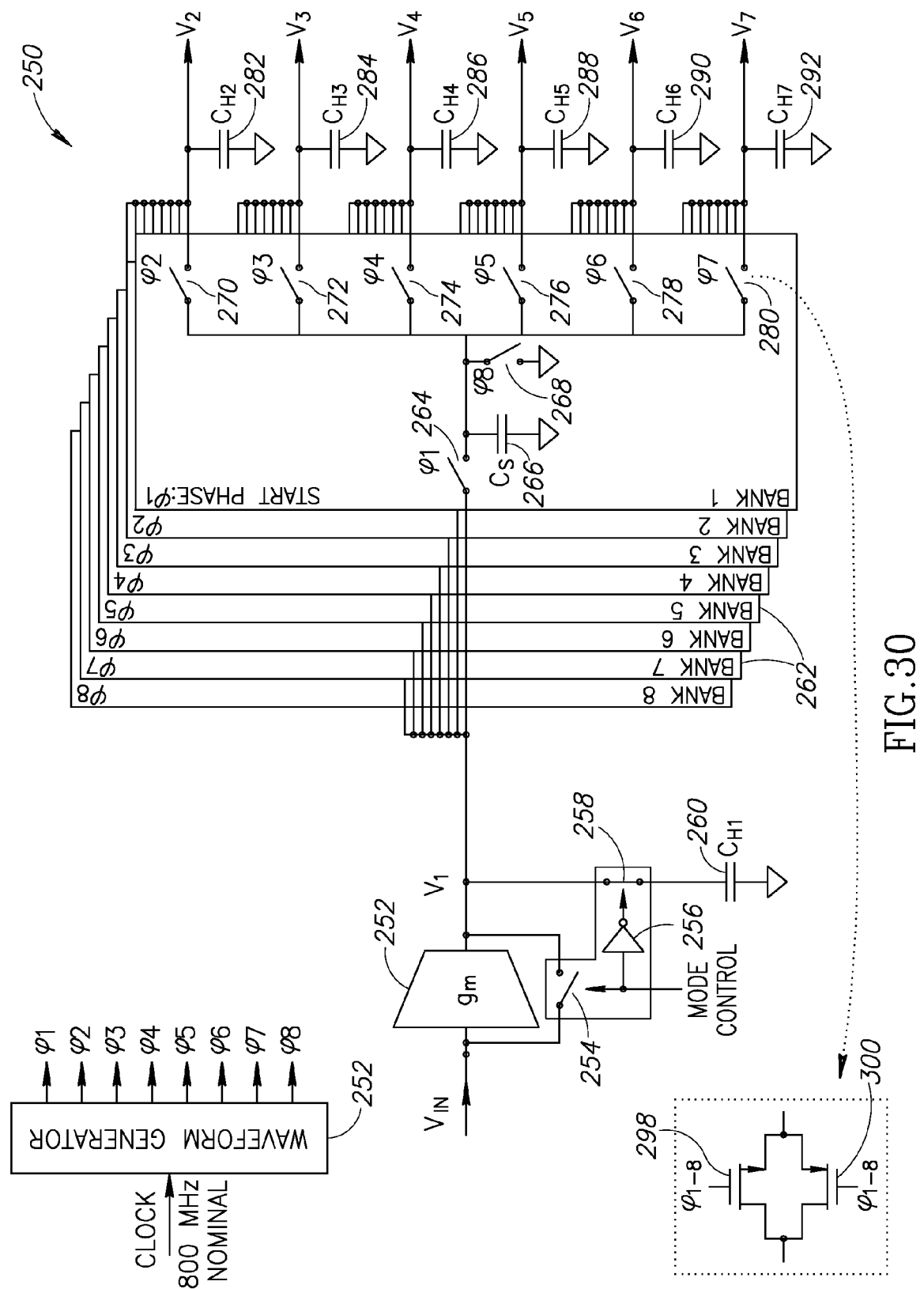
FIG. 30 is a schematic diagram illustrating an example implementation of a full rate charge rotating IIR7 filter.

As shown in FIG. 30, in one embodiment, the switches of the filter are implemented using transmission gates. Equal NMOS and PMOS sizes are selected to cancel out clock feedthrough and charge injection by one order and to have a lower on-resistance ($R_{on}$) at the same time. Transistors should be sized carefully to have a low enough $R_{on}$ for good settling time on the sampling capacitors. A general rule of thumb is that four times the settling time constant ($4 \times R_{on}C_S$) should be lower than $1/f_{ref}$ (for all PVT corners), which leads to a better than 98% settling. This ensures high linearity of the passive switched-capacitor circuit. For higher linearity, $R_{on}$ can be further reduced to reduce the settling error. On the other hand, excessive oversizing of the transistors increases the parasitic capacitance between their source and drain. The filter then experiences signal crosstalk between different nodes while the switches are off. This effect limits the maximum stop-band rejection of the implemented filter.

Figure 32:
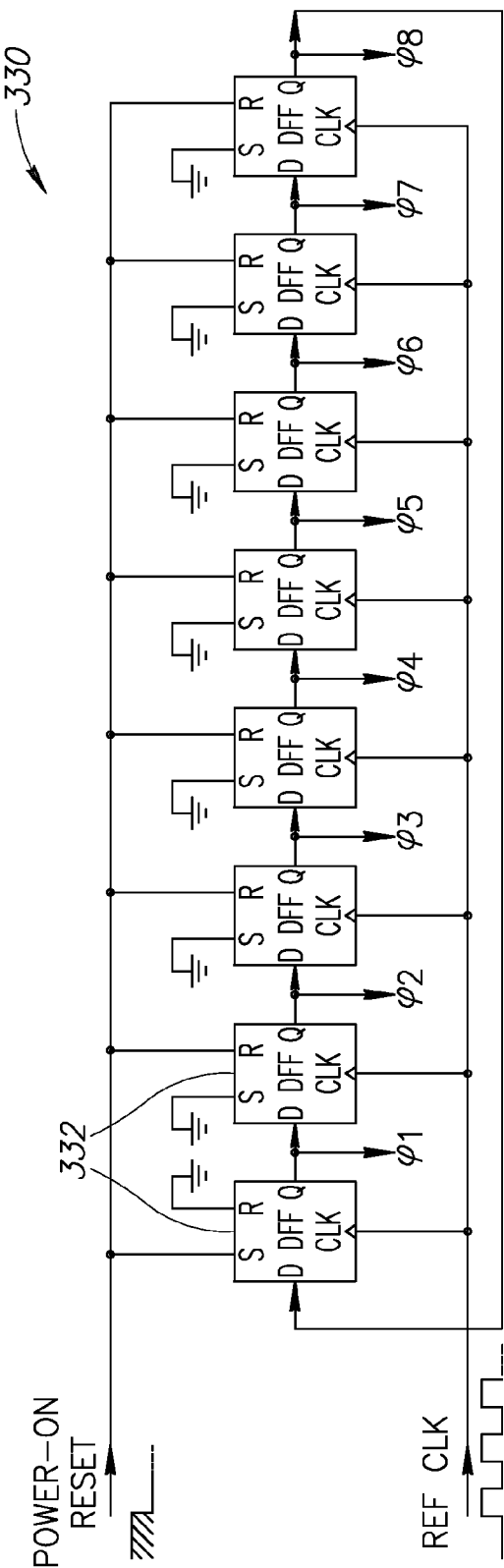
FIG. 32 is a schematic diagram illustrating an example waveform generator circuit.
Figure 33:
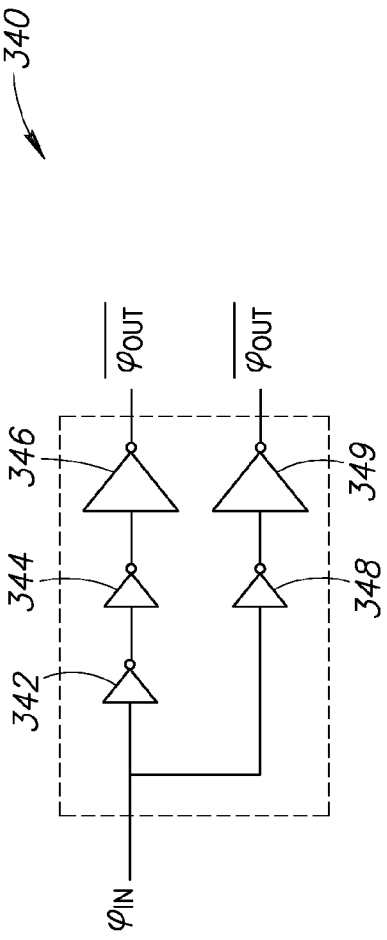
FIG. 33 is a schematic diagram illustrating an example output buffer of the waveform generator circuit of FIG. 32.

In one embodiment, the waveform generator block, generally referenced 330 in FIG. 32, comprises a "bubble circulator" consisting of eight D flip-flops (DFF) 332. At power-on, the DFFs are set/reset to the sequence of "10000000". Then, at each successive cycle of the input clock, it is rotated one step. In this way, all the required phases are generated from a single reference clock. As shown in FIG. 33, outputs of the DFFs are fed to buffer cells 340 before driving the switches. The buffer, comprising inverters 342, 344, 346, 348, 349 generates both ϕ and $\overline{\phi}$ and is able to drive the switches with sharp rising and falling edges. Since both outputs need to be aligned, the size of the pre-driver inverter in the non-inverting path is reduced. Also, the size of NMOS and PMOS transistors in the buffer are skewed to ensure non-overlapping between consecutive phases.

As shown in FIG. 30, analog multiplexer 294 enables internal operations of the filter to be monitored. By means of the multiplexer, different outputs (orders) of the filter can be monitored as well as the internal on-chip input of the filter. In addition, by monitoring the internal input of the filter the measurement setup can be calibrated and the added losses and noise de-embedded. Following the multiplexer, an output buffer is used to isolate the inside of the chip from the outside environment. Since the output signal is a differential signal, two separate single-ended buffers are used. These buffers drive a 50Ω output load, drain 8.65 mA in total from a separate 1.5V power supply.

In one embodiment, routing of the multiphase clock signal requires attention to detail. At first, parasitic coupling of the clock signals and analog data signals are preferably avoided or at least minimized. For each of the phases, we have differential clocks (ϕ and $\overline{\phi}$). Therefore, in the event of parasitic routing capacitance between ϕ and one analog signal path, we try to have the same amount between $\overline{\phi}$ and that one too, so that they attempt to cancel out each other. In addition, all analog data signals are differential and they are kept as symmetric as possible. In this way, if a clock path is coupled to one of them, it is also coupled to the other one. In that case, it can create at most common-mode clock feedthrough. The worst case of parasitic coupling occurs when ϕ is coupled to a positive data path and $\overline{\phi}$ is coupled to its negative data path (or vice versa). In that case, in addition to the maximum clock feedthrough, a constant dc offset at the output of the filter might be created. Another way to create more isolation between signal paths and clock routings is to insert a grounded shielding plate wherever they are close or parallel to each other. All the above mentioned techniques can be employed in this filter to avoid the clock feedthrough and dc offset.

Figure 34:
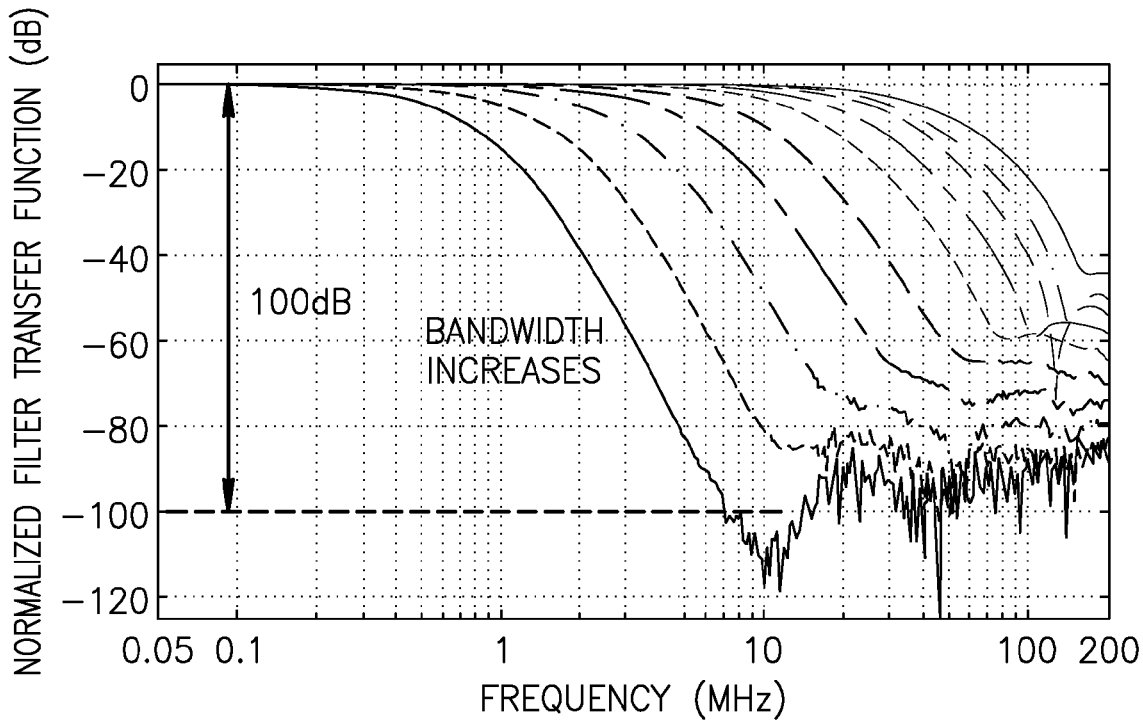
FIG. 34 is a diagram illustrating the measured transfer function of the charge rotating IIR7 filter for the $7^{th}$-order output with different bandwidth settings.
Figure 35:
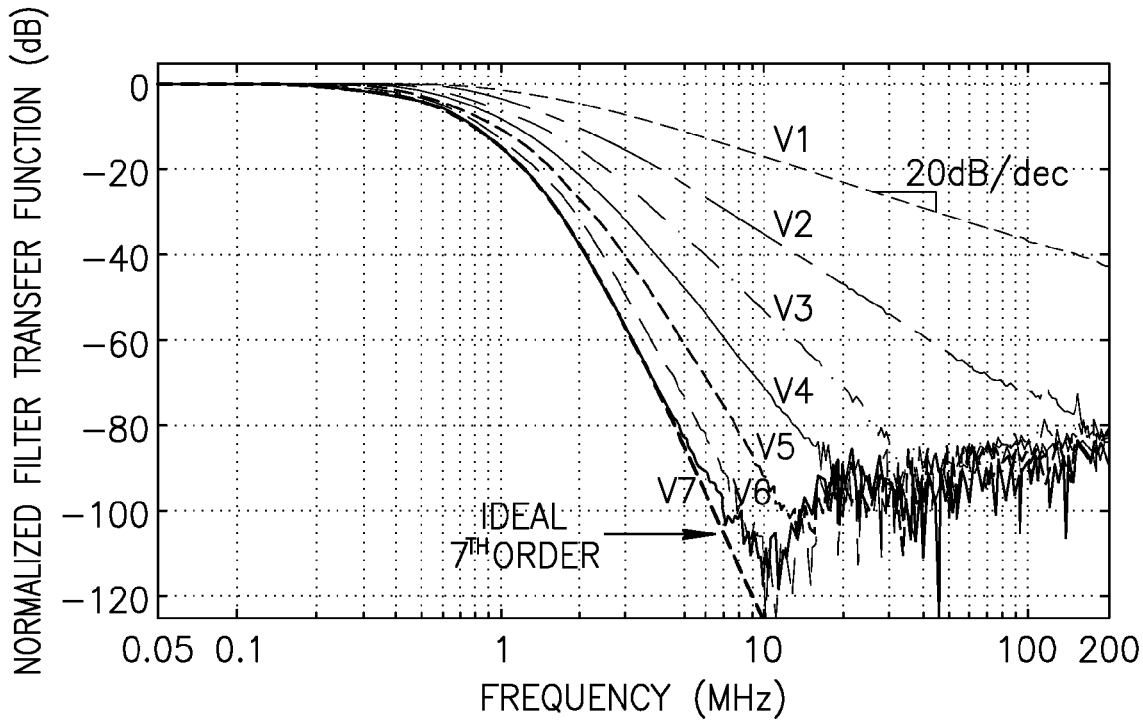
FIG. 35 is a diagram illustrating the measured transfer function of the charge rotating IIR7 filter for different orders in 400 kHz bandwidth setting.

Discrete-time output data of the chip has a step-like waveform in the continuous-time domain. In other words, it appears as a ZOH continuous-time signal at the output. Hence, the output signal can be directly measured and evaluated without any other required conversion. The measured frequency response of the filter in the charge sampling mode at the $7^{th}$-order output for different bandwidth setting is shown in FIG. 34. The 3 dB bandwidth is programmable from 400 kHz to 30 MHz. A maximum 100 dB stop-band rejection is measured for the 400 kHz bandwidth. This rejection is proportional to the ratio of the history capacitor over the drain-source parasitic capacitance of the switches. Therefore, by increasing the bandwidth, the stop-band rejection is degraded due to the lowered history capacitor. Measured transfer function of the filter in the charge-sampling mode, but now for different outputs (orders), is depicted in FIG. 35. In this measurement, the 400 kHz bandwidth setting is used. As shown in FIG. 35, the slope of the filtering function gets sharper when switching towards a higher order output. The measured $7^{th}$-order output is also compared with an ideal mathematical $7^{th}$-order transfer function shown in the dashed trace, indicating very good agreement between theory and measurement. The transfer function of the filter in the voltage sampling mode is similar to FIGS. 34 and 35 except that the filtering order is 6th.

Figure 36:
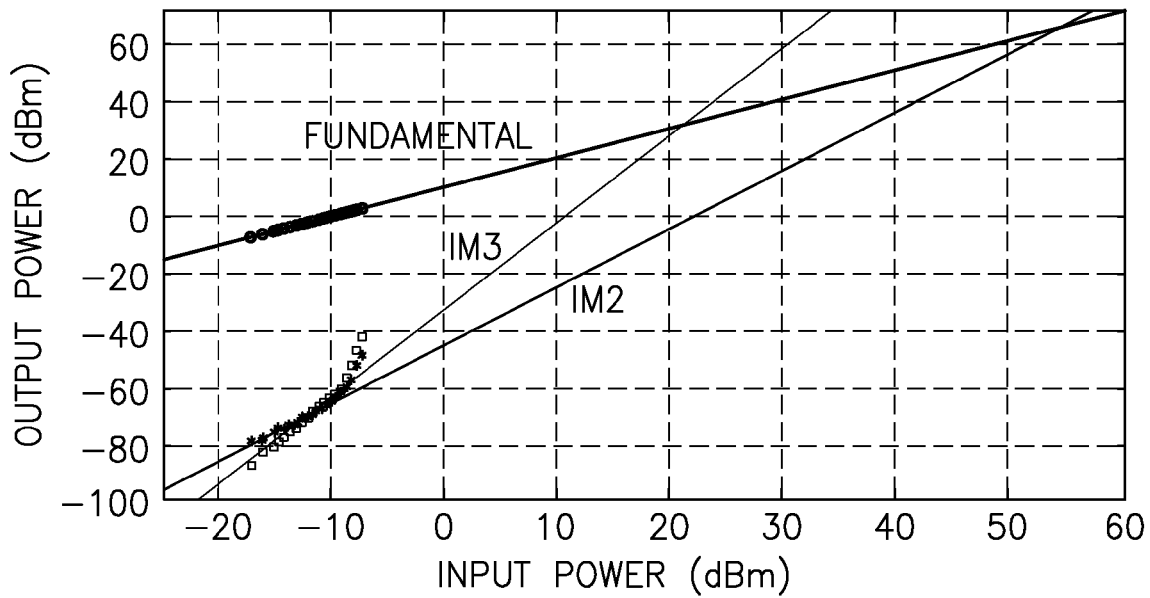
FIG. 36 is a diagram illustrating the in-band IIP2 and IIP3 measurements of the charge rotating IIR7 filter in charge sampling mode.
Figure 37:
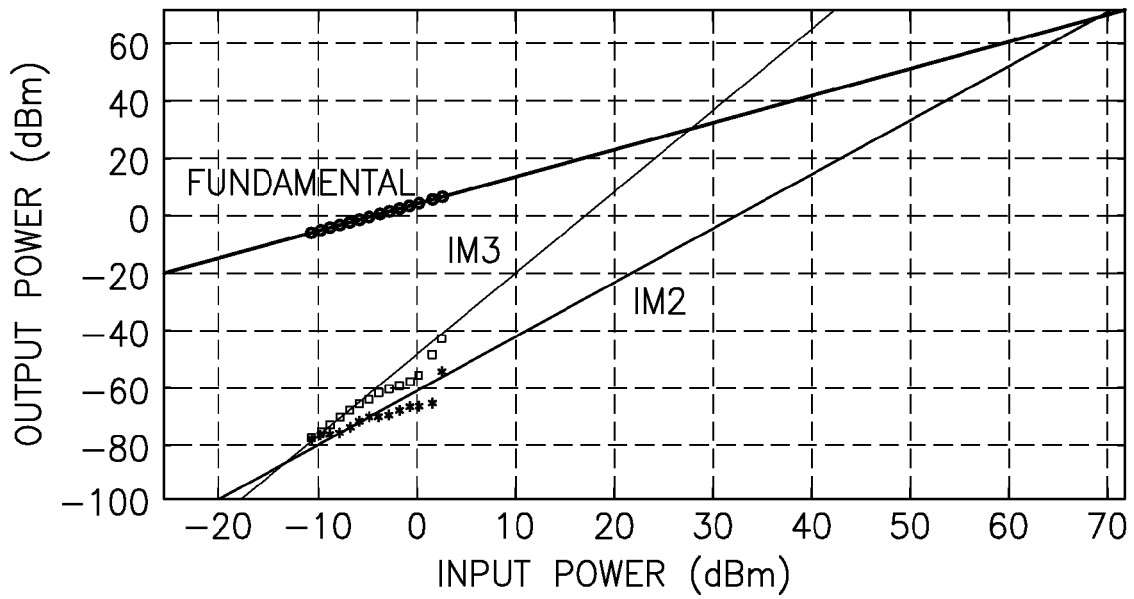
FIG. 37 is a diagram illustrating the in-band IIP2 and IIP3 measurements of the charge rotating IIR7 filter in voltage sampling mode.

To evaluate linearity of the filter, a two-tone test can be performed. Two single-tone signals from separate signal sources are combined together by a hybrid combiner to isolate them. Since outputs of the two signal sources can affect each other and create unwanted sideband tones, a resistive combiner should be avoided. The combined signal is fed to the filter and its output is evaluated by a spectrum analyzer. For an in-band linearity test, the two input tones are applied at 3 MHz and 4 MHz. The measured $2^{nd}$ and $3^{rd}$ order intermodulation products at the output of the filter at 9 MHz bandwidth versus the input power for the charge-sampling mode is shown in FIG. 36. The calculated IIP2 and IIP3 are +55 dBm and +21 dBm (with respect to 50Ω), respectively. FIG. 37 shows intermodulation products in the voltage-sampling mode of the filter at 9.7 MHz bandwidth. The corresponding IIP2 and IIP3 are +69 dBm and +28 dBm, respectively. It should be emphasized that these two values are limited by the linearity of the output buffers and, therefore, the actual IIP2 and IIP3 should be better than shown. This excellent level of linearity is due to the fully passive operation of the filter in the voltage sampling mode. For out-of-band linearity, the two input tones are located at 30 MHz and 35 MHz for IIP2 and 20 MHz and 35 MHz for IIP3 test. Measured out-of-band IIP2 and IIP3 are +60 dBm and 11.7 dBm for the charge-sampling mode, and +68 dBm and +25 dBm for the voltage-sampling mode, respectively. In the charge-sampling mode, where the linearity is limited by the gm-cell, IIP3 might be lowered a few dBs in practice caused by PVT variations.

To be able to compare the 1-dB compression point of our filter in its two operational modes to other filters with various gains, we compares the output compression point as $$P_{1dB,out} = P_{1dB,in} + \text{Gain} - 1 \quad (45)$$

Measured output compression point of the filter in the charge-sampling mode is +4.6 dBm. In the voltage-sampling mode, this value goes higher than +14 dBm.

Figure 38:
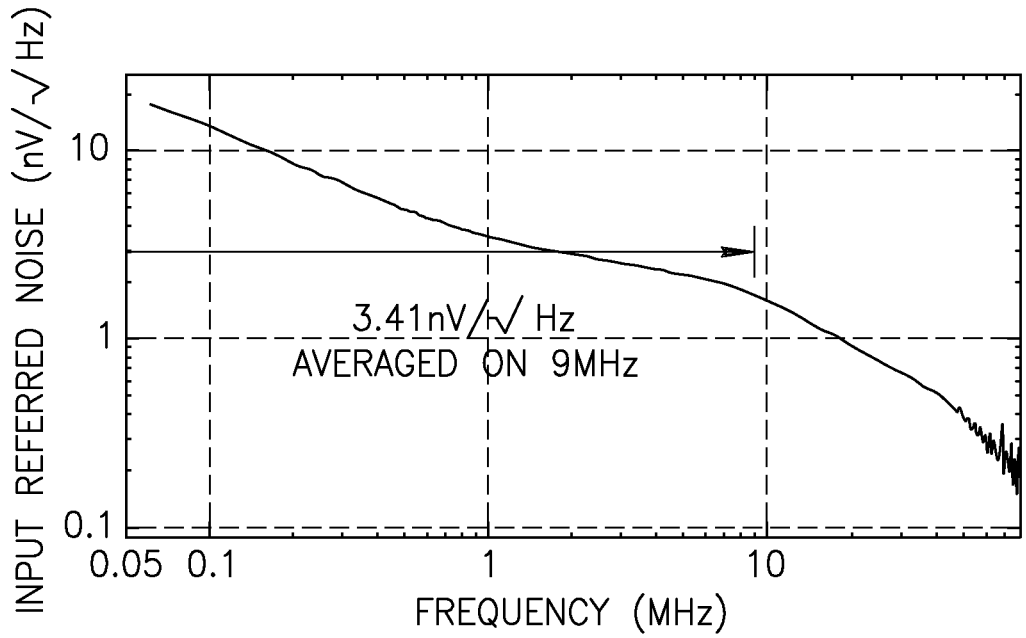
FIG. 38 is a diagram illustrating the measured input-referred filter in charge sampling mode.
Figure 39:
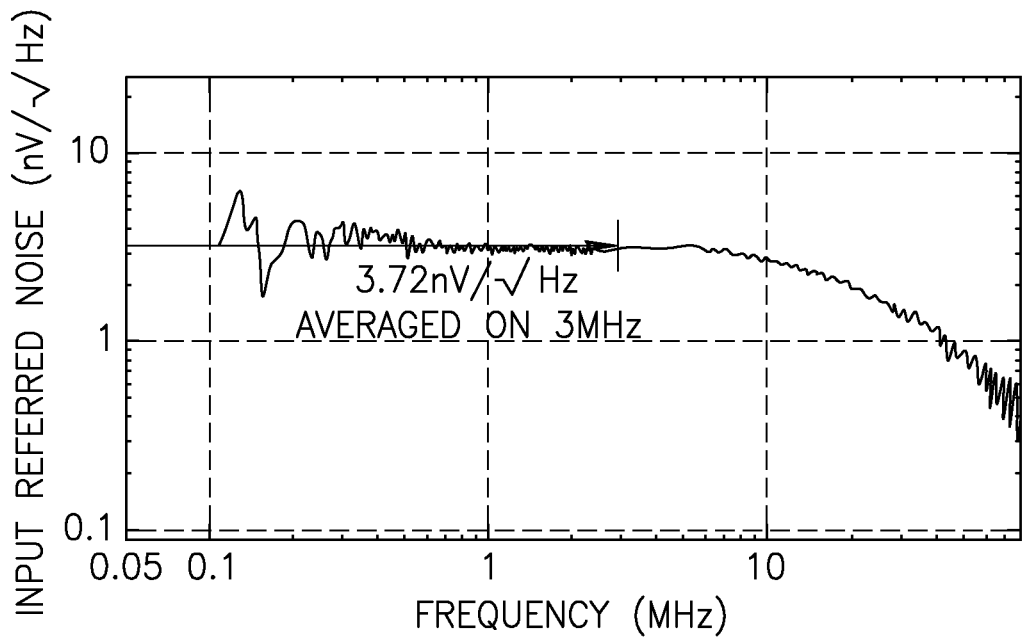
FIG. 39 is a diagram illustrating the measured input-referenced filter in voltage sampling mode.

Filter noise can be evaluated using a spectrum analyzer. For this measurement, the input of the filter is grounded. To measure filter noise, a two-step process is carried out: (1) measuring total output noise (including the noise of the filter and output buffer) and (2) disabling the filter and measuring the noise of only the output buffer. Then, since noise of the buffer and the filter are uncorrelated, the filter noise is calculated by subtracting the total noise PSD and the buffer noise PSD. The measured input-referred noise (IRN) spectral density of the filter in the charge-sampling mode for the 9 MHz bandwidth setting is shown in FIG. 38. The slope below 1 MHz is due to the flicker noise and bias noise of the gm-cell. Noise between 1 MHz and 20 MHz is mainly the thermal noise of the gm-cell shaped by the filter transfer function and the remainder is predominantly switched-capacitor circuit noise. The averaged spot noise over the bandwidth is 3.41 nV/√Hz. Integrated noise, $P_N$, from 50 kHz to 9 MHz is 10.2 $\mu V_{rms}$, which increases to 12.2 $\mu V_{rms}$ for the entire frequency range. This yields a 72 dB spurious-free dynamic range (SFDR).

$$\text{SFDR} = \tfrac{2}{3} \cdot (IIP3 - P_N) \quad (47)$$

where IIP3 and $P_N$ are in dBm and SFDR is in dB. As measured by a single-tone test, a −3.5 dBm input signal (422 mV peak-to-peak differential) creates −40 dB $3^{rd}$-harmonic distortion (HD3) at the output. This gives an 87 dB dynamic range (1% HD3 DR) for the 9 MHz bandwidth. Measured input-referred noise of the filter in the voltage-sampling mode for the 3.1 MHz bandwidth is illustrated in FIG. 39. In this mode, the entire noise spectrum is due to the switched-capacitor network. The spot IRN averaged over the bandwidth is 3.71 nV/√Hz. The integrated IRN over the bandwidth is 6.7 $\mu V_{rms}$ and rises to 17.1 $\mu V_{rms}$ for the entire frequency range. This results in 79 dB SFDR. As measured, a single tone input signal as large as 8.8 dBm (1.75V peak-to-peak differential) creates 1% HD3 in this mode. This results in 101 dB dynamic range. Again this value is limited by output swing of the buffer, not the filter itself. Measured clock feedthrough at the output of this filter is less than −110 dBm at $f_{ref}/8$=100 MHz. This very low value avoids any noise and spur problem caused by the clock signal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

The corresponding structures, materials, acts and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application and to enable others of ordinary skill in the art to understand the invention for various embodiments with various modifications as are suited to the particular use contemplated.

What is claimed is:

1. A discrete time analog filter, comprising:
an input node for receiving an input signal;
a plurality of history capacitors ($C_H$);
a sampling capacitor ($C_S$) coupled to said plurality of history capacitors and operative to cyclically share charge with said plurality of history capacitors;
wherein during each multi-phase cycle of said filter, each history capacitor is individually connected to said sampling capacitor such that only a single history capacitor is connected to said sampling capacitor during each phase; and
wherein an output node generates a filtered output signal once each cycle.

2. The analog filter according to claim 1, wherein said sampling capacitor is periodically discharged to ground once per cycle.

3. The analog filter according to claim 1, further comprising an output node coupled to one of said plurality of history capacitors.

4. The analog filter according to claim 1, wherein said sampling capacitor charge sharing has a predetermined time duration.

5. The analog filter according to claim 1, wherein said sampling capacitor performs charge sharing sequentially with said history capacitors each cycle.

6. The analog filter according to claim 1, wherein said sampling capacitor performs charge sharing repeatedly with said history capacitors.

7. The analog filter according to claim 1, further comprising a $g_m$ cell coupled to said input node and configured to generate current that is integrated on said one of said history capacitors.

8. The analog filter according to claim 1, further comprising a set of switches configured to perform charge sharing between said sampling capacitor and said history capacitors.

9. The analog filter according to claim 8, further comprising a multi-phase clock operative to turn on said switches at appropriate times.

10. The analog filter according to claim 1, wherein an output is generated once per cycle period.

11. The analog filter according to claim 1, wherein one of said plurality of history capacitors ($C_{H1}$) is coupled to said input node.

12. A discrete time analog filter, comprising:
   an input node for receiving an input signal;
   a first history capacitor ($C_{H1}$) coupled to said input node;
   a plurality of switch banks coupled to said first history capacitor, each switch bank comprising:
      a sampling capacitor configured to share charge with said first history capacitor;
      a plurality of second history capacitors ($C_H$) coupled to and configured to cyclically share charge with the sampling capacitor in each respective switch bank;
      wherein during each multi-phase cycle of said filter, each second history capacitor is individually connected to its respective sampling capacitor such that only a single second history capacitor is connected to said sampling capacitor during each phase; and
   wherein an output node generates a filtered output signal once each phase period.

13. The analog filter according to claim 12, wherein the sampling capacitor in each bank is periodically discharged to ground once per cycle.

14. The analog filter according to claim 12, wherein each sampling capacitor is connected to a different history capacitor.

15. The analog filter according to claim 12, wherein each history capacitor is connected to a different sampling capacitor.

16. The analog filter according to claim 12, wherein each switch bank comprises a plurality of switches, each switch coupled to its sampling capacitor and to a respective one of said second history capacitors, said plurality of switches operative to perform charge sharing between its sampling capacitor and respective said second history capacitors.

17. The analog filter according to claim 16, further comprising a multi-phase clock operative to turn on said plurality of switches in each switch bank at appropriate times resulting in pipelined operation of said analog filter.

18. The analog filter according to claim 17, wherein an output is generated once per sample period.

19. The analog filter according to claim 12, further comprising a $g_m$ cell coupled to said input node and configured to generate current that is integrated on said first history capacitor.

20. A method of analog filtering in discrete time, the method comprising:
   receiving an input signal;
   charging a first history capacitor with said input signal;
   sharing charge with a sampling capacitor coupled to said first history capacitor;
   cyclically sharing charge with a plurality of second history capacitors;
   wherein during each multi-phase cycle of said filter, each second history capacitor is individually connected to said sampling capacitor such that only a single second history capacitor is connected to said sampling capacitor during each phase; and
   wherein an output node generates a filtered output signal once each cycle.

21. The method according to claim 20, wherein said sampling capacitor is periodically discharged to ground once per cycle.

22. A discrete time analog filter, comprising:
   an input node for receiving an input signal;
   a plurality of switch banks coupled to said input signal, each switch bank comprising:
      a first switch coupled to said input signal;
      a sampling capacitor coupled to said first switch and configured to cyclically share charge with a plurality of history capacitors ($C_H$) during each cycle of the filter;
      a plurality of second switches, each switch coupled to said sampling capacitor and to a respective history capacitor;
      wherein during each multi-phase cycle of said filter, each history capacitor is individually connected to its respective sampling capacitor such that only a single history capacitor in each switch bank is connected to its respective sampling capacitor during each phase; and
   wherein an output node generates a filtered output signal once each phase period.

\* \* \* \* \*